United States Patent [19]
Mizouchi

[11] Patent Number: 5,963,305
[45] Date of Patent: Oct. 5, 1999

[54] ILLUMINATION SYSTEM AND EXPOSURE APPARATUS

[75] Inventor: Satoru Mizouchi, Utsunomiya, Japan

[73] Assignee: Canon Kabushiki Kaisha, Tokyo, Japan

[21] Appl. No.: 08/927,294

[22] Filed: Sep. 11, 1997

[30] Foreign Application Priority Data

Sep. 12, 1996 [JP] Japan .................................. 8-263594
Dec. 20, 1996 [JP] Japan .................................. 8-355390

[51] Int. Cl.⁶ .......................... G03B 27/54; G03B 27/42
[52] U.S. Cl. ................................. 355/67; 355/53; 362/268
[58] Field of Search .................................. 355/53, 67, 71;
362/268, 32, 308, 309, 331; 359/209, 211,
618, 619, 621, 622, 623, 626, 628

[56] References Cited

U.S. PATENT DOCUMENTS

| | | | |
|---|---|---|---|
| 4,988,188 | 1/1991 | Ohta ......................................... | 355/53 |
| 5,098,184 | 3/1992 | Brandt et al. .......................... | 362/309 |
| 5,418,583 | 5/1995 | Masumoto .............................. | 362/268 |
| 5,684,567 | 11/1997 | Shiozawa ................................ | 355/67 |
| 5,798,824 | 8/1998 | Kudo ...................................... | 355/67 |

FOREIGN PATENT DOCUMENTS 60-158449  8/1985  Japan .
6-132195   5/1994  Japan .

*Primary Examiner*—Alan A. Mathews
*Attorney, Agent, or Firm*—Fitzpatrick, Cella, Harper & Scinto

[57] ABSTRACT

An illumination system includes an optical integrator having an element lenses arrayed in a direction perpendicular to an optical axis, and an optical system for directing lights from the element lenses of the integrator t a surface to be illuminated, wherein the element lenses include particular element lenses having different optical characteristics which are determined so that upon the surface to be illuminated those lights from the particular element lenses are partly superposed one upon another to provide a non-uniform illuminance ditribution on the surface with respect to a predetermined direction.

23 Claims, 28 Drawing Sheets

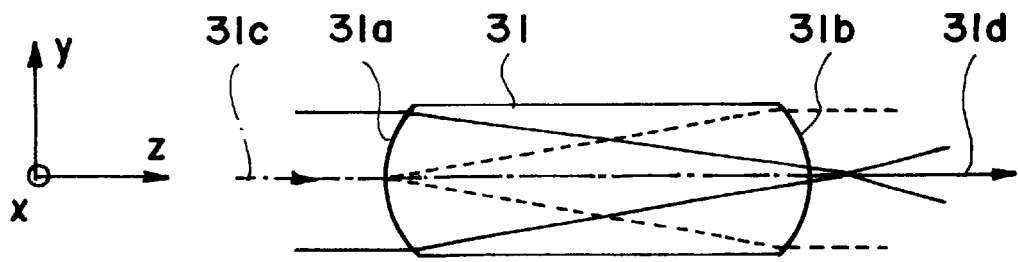
F I G. 5A
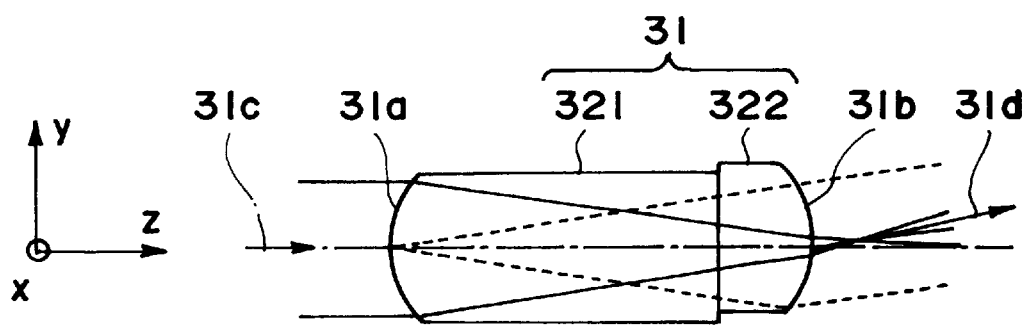
F I G. 5B
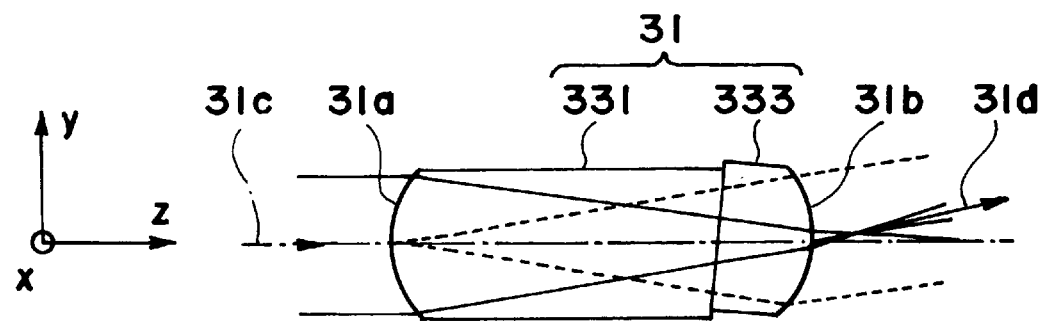
F I G. 5C

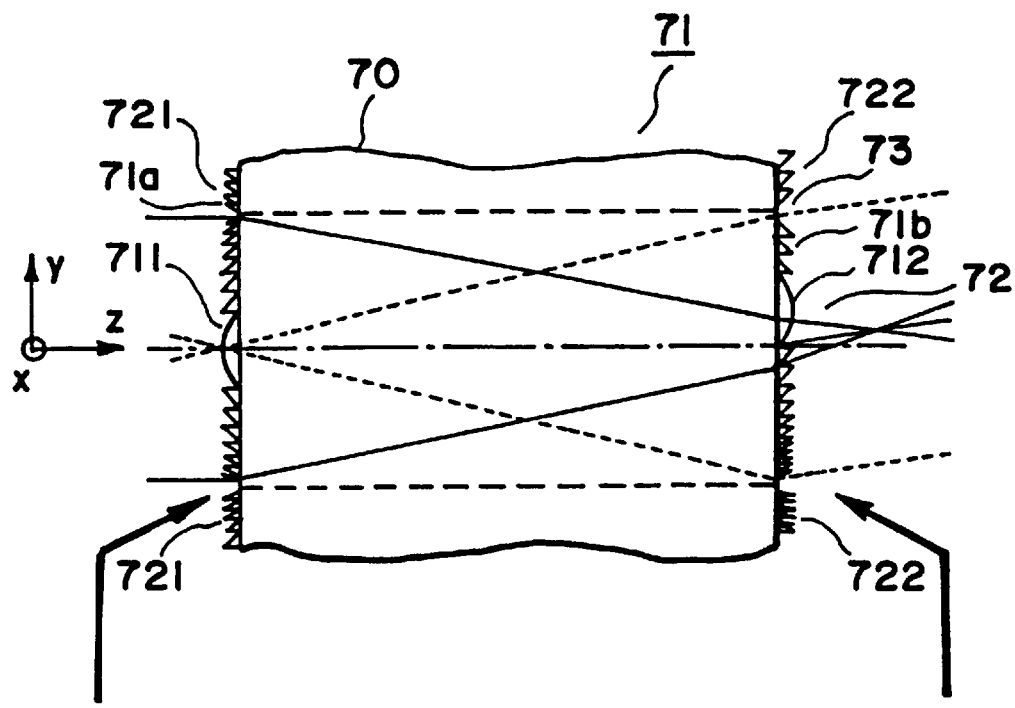
FIG. 9A
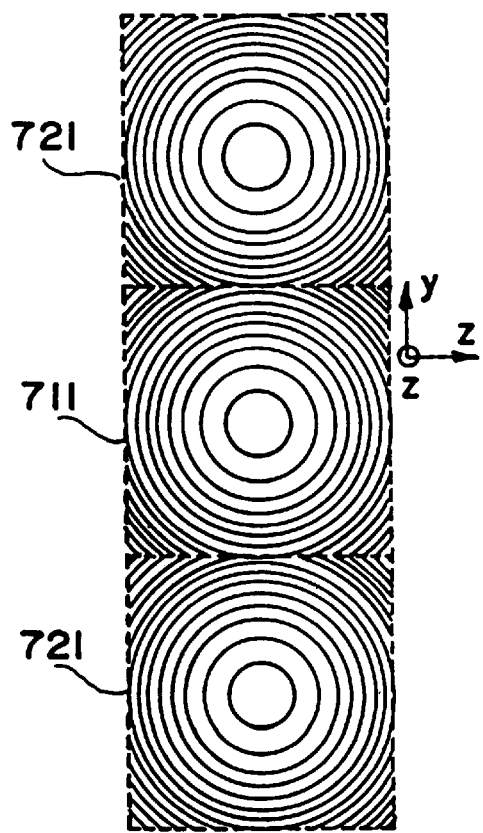 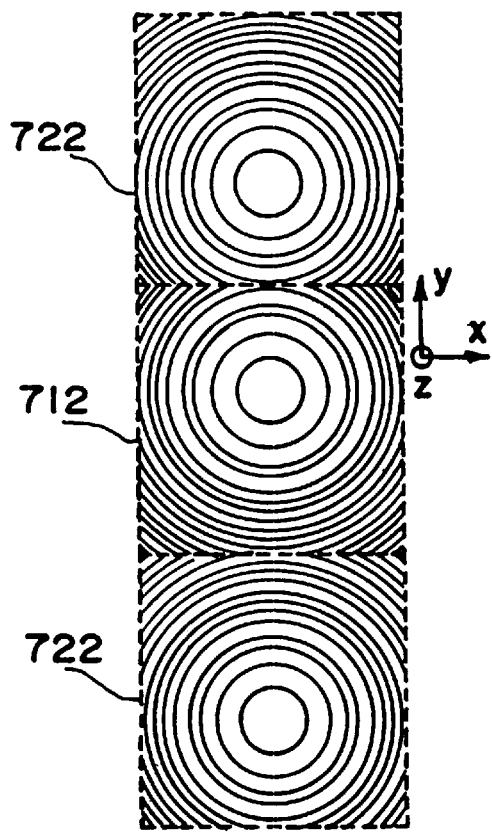
FIG. 9B     FIG. 9C

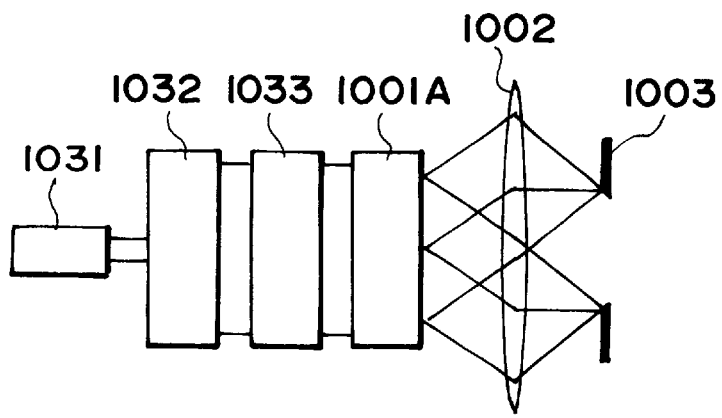
F I G. 14
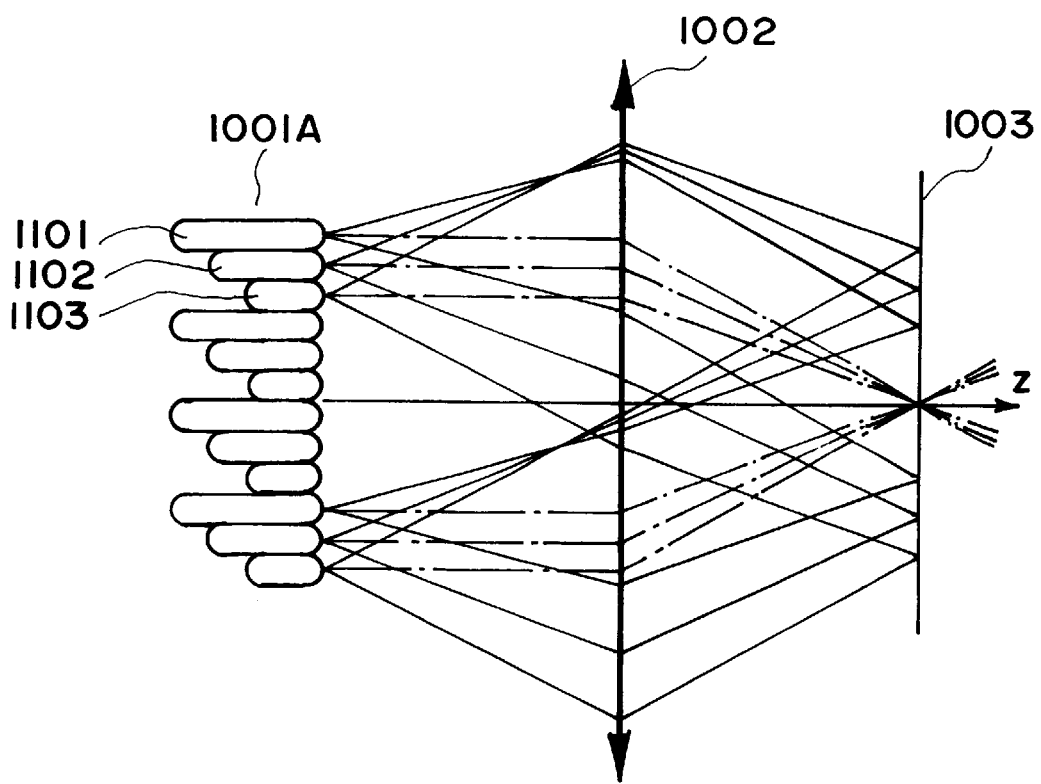
F I G. 15

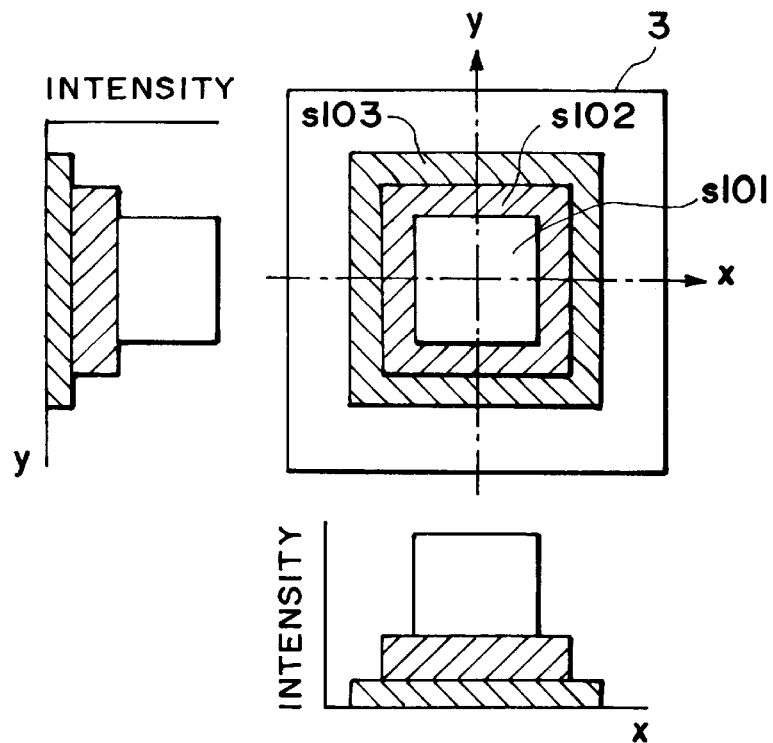
F I G. 16
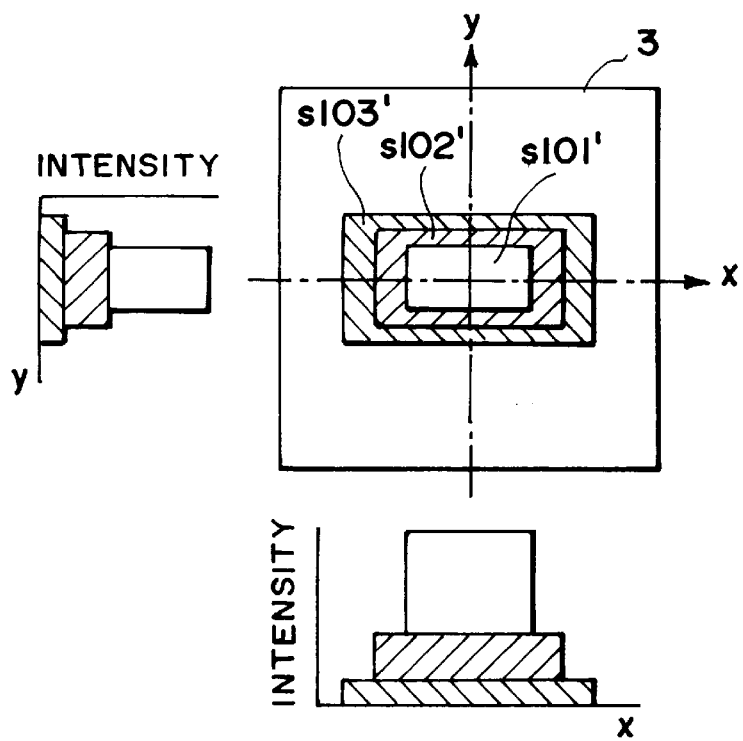
F I G. 17

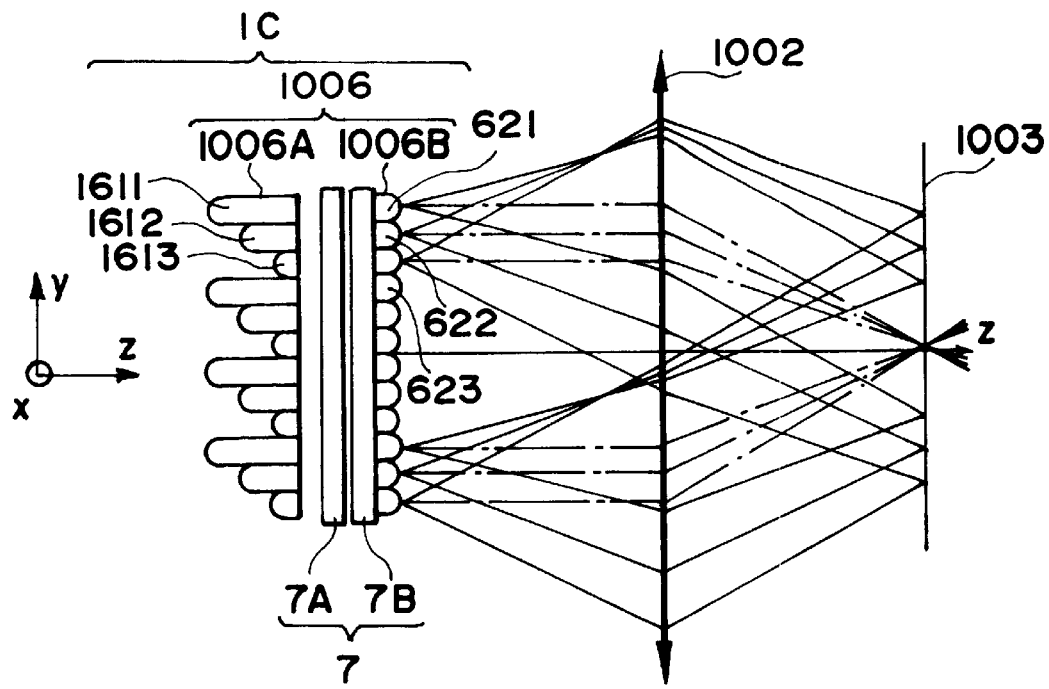
F I G. 21A
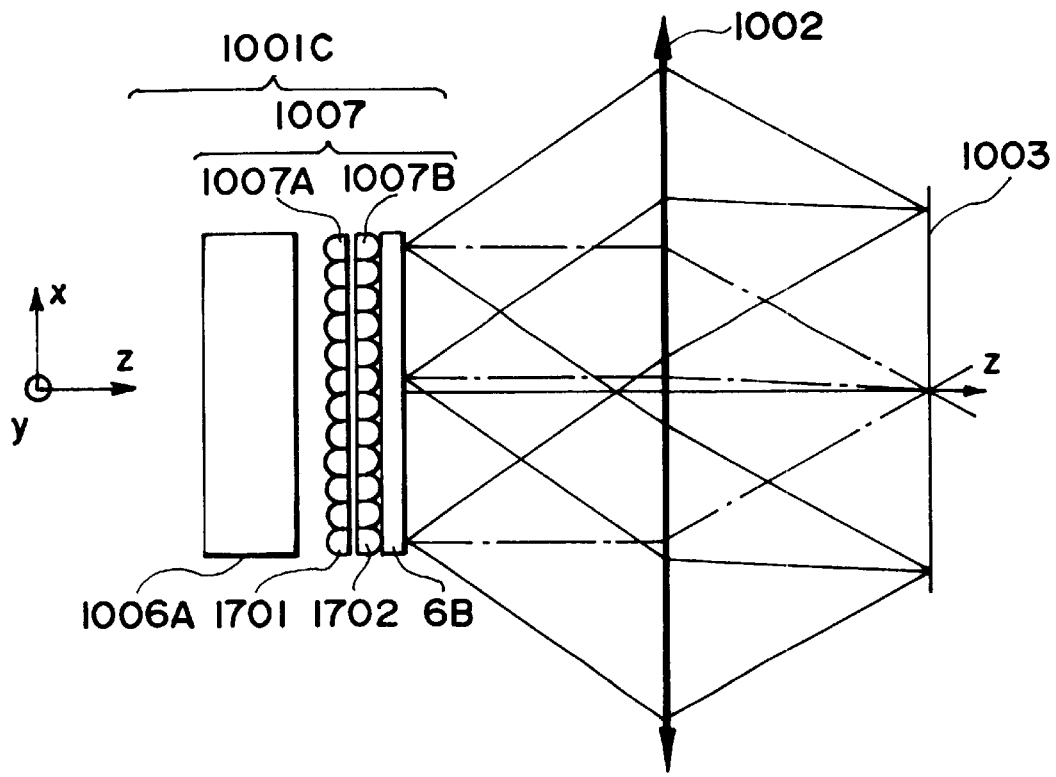
F I G. 21B

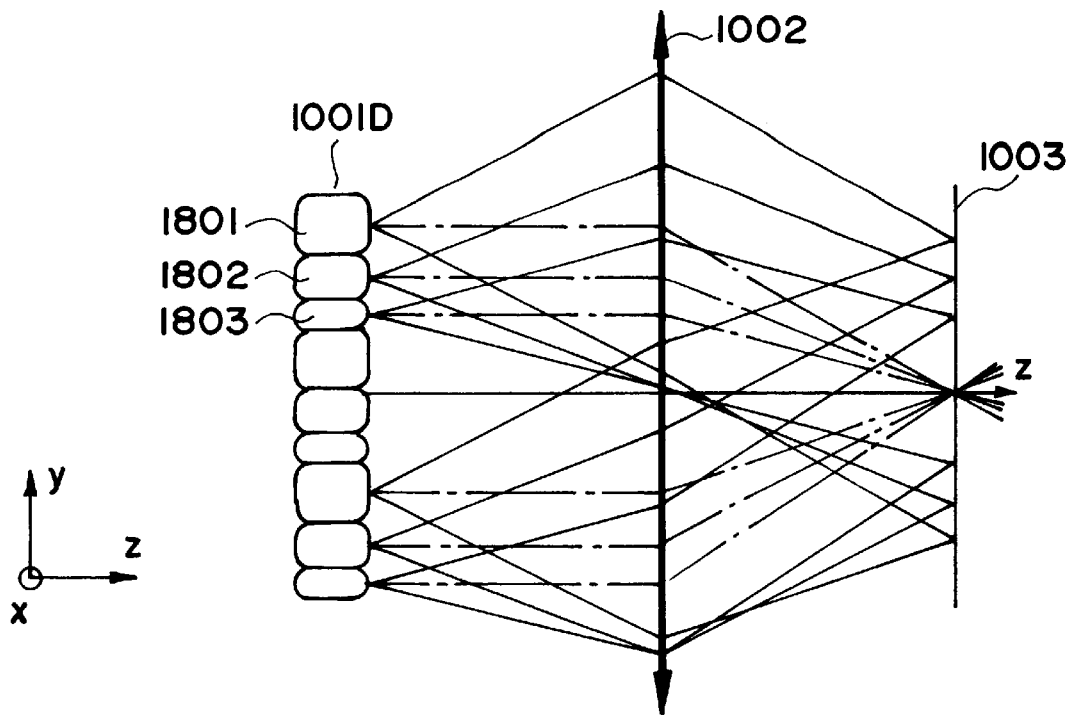
F I G. 22
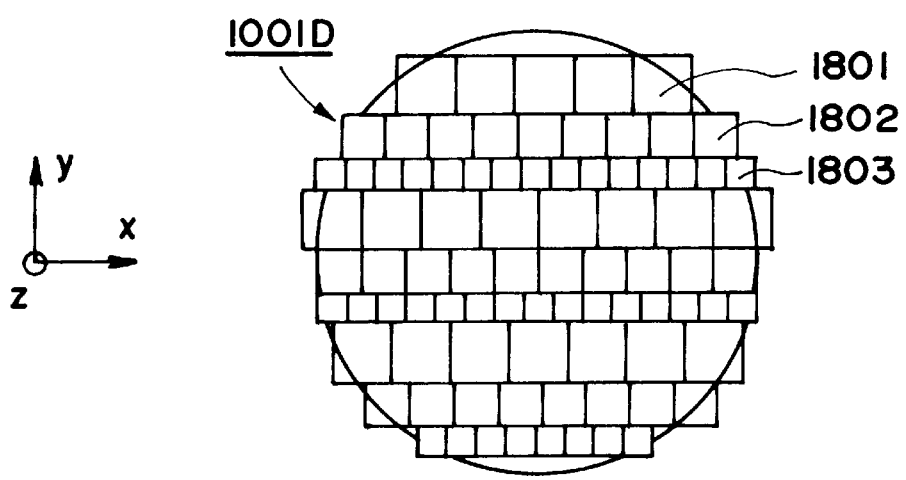
F I G. 23

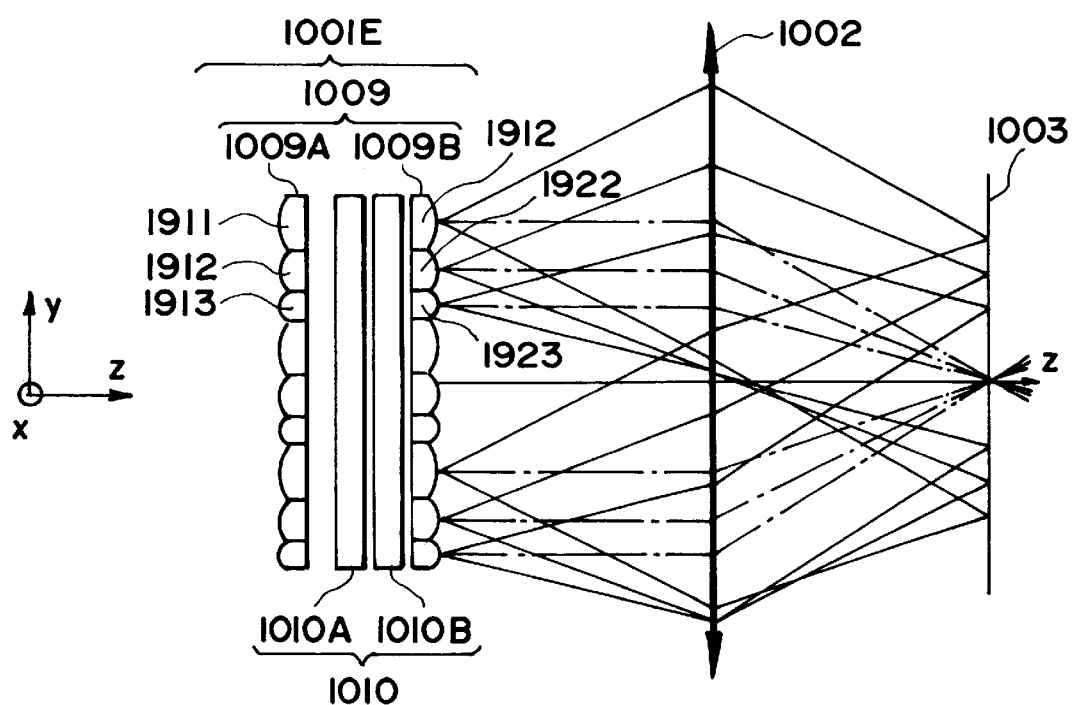
F I G. 24

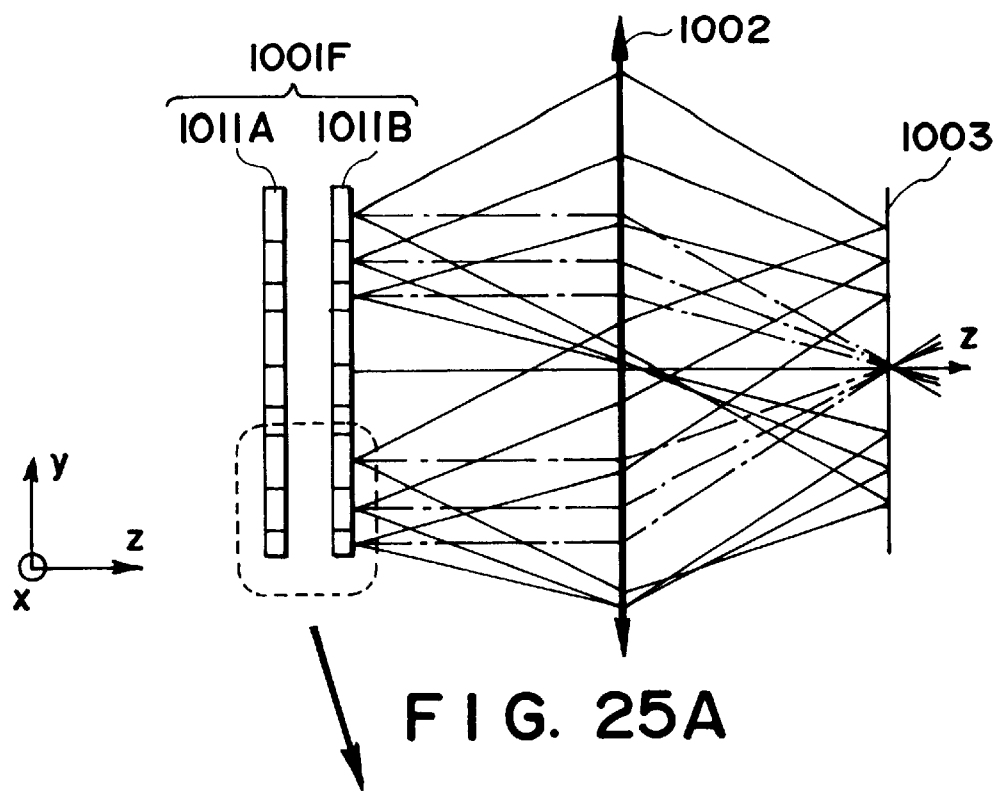
F I G. 25A
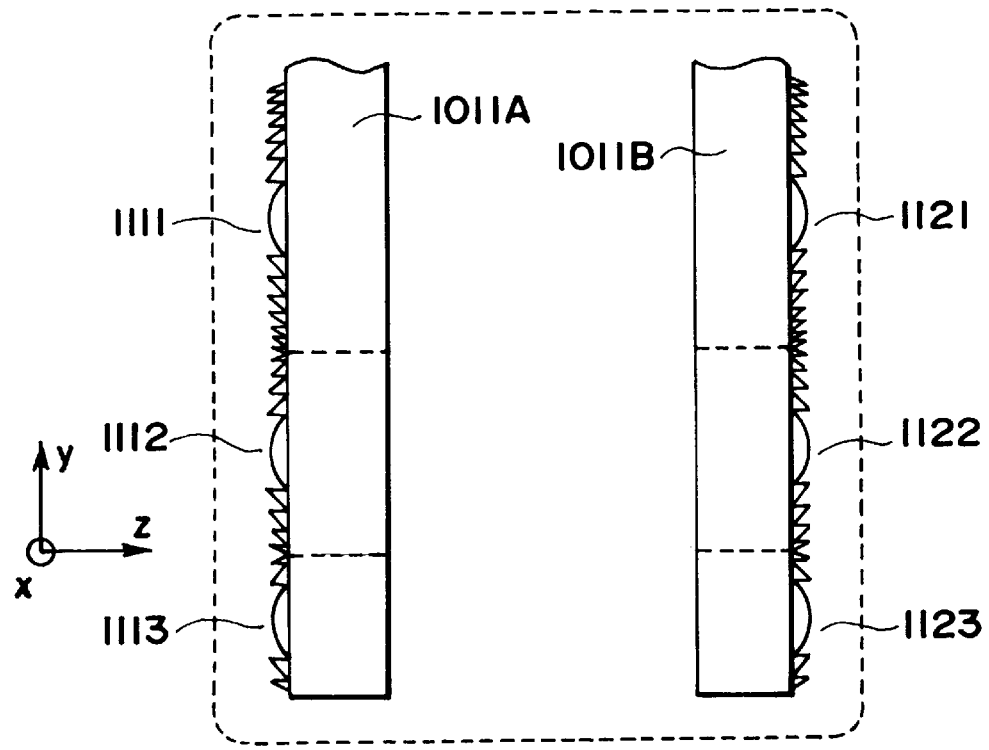
F I G. 25B

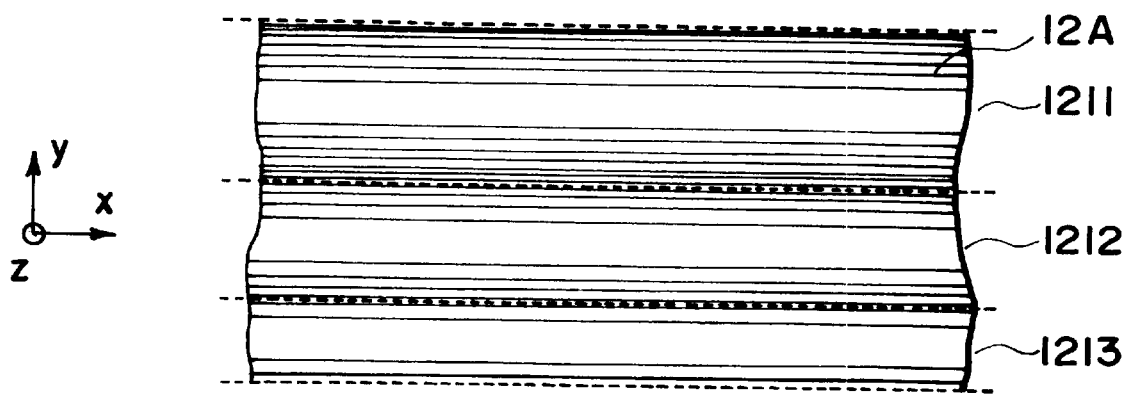
F I G. 28

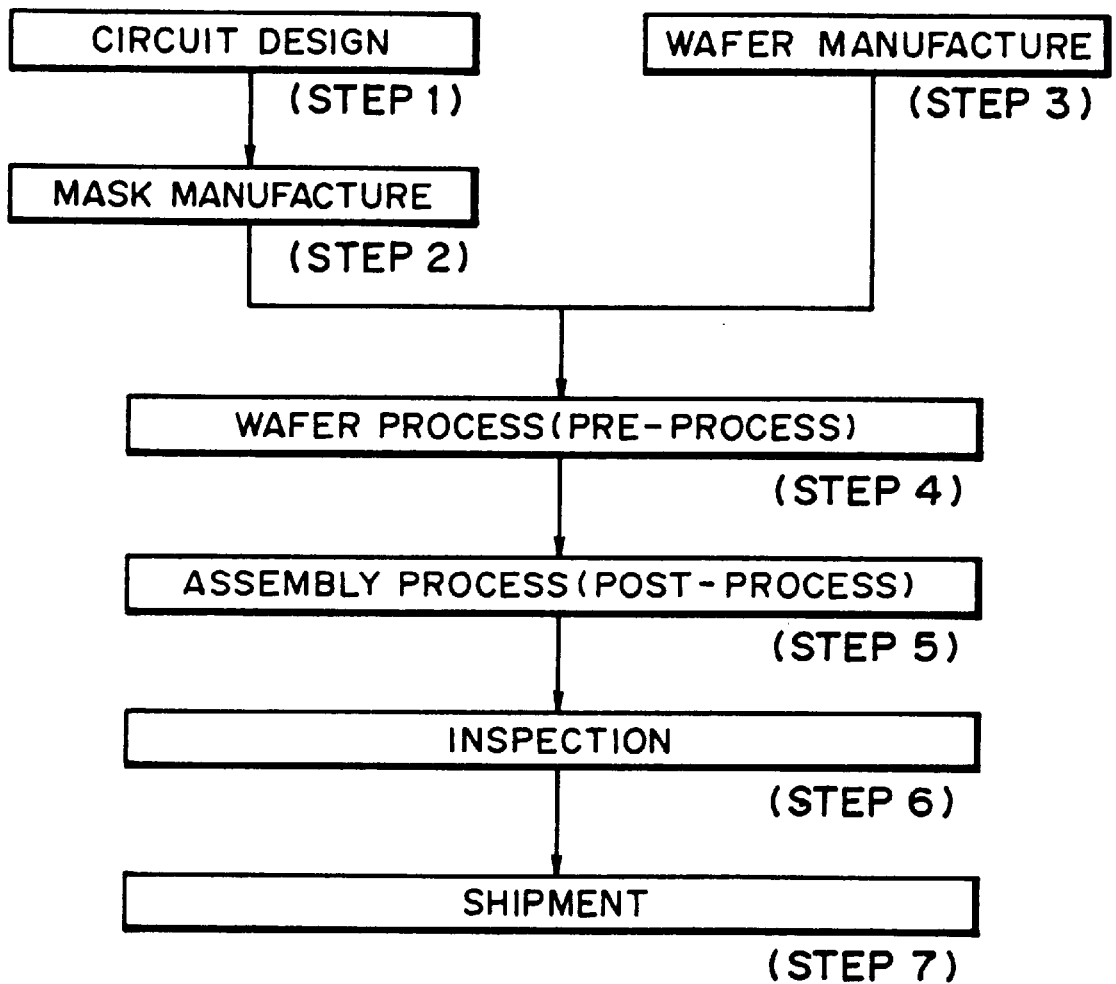
F I G. 31

ILLUMINATION SYSTEM AND EXPOSURE APPARATUS

FIELD OF THE INVENTION AND RELATED ART

This invention relates to an illumination system and an exposure apparatus suitably usable, for example, in the manufacture of devices such as semiconductor devices (e.g., ICs or LSIs), image pickup devices (e.g., CCDs), display devices (e.g., liquid crystal panels) or magnetic heads, for printing through projection exposure or scanning projection exposure an electronic circuit pattern of a mark or reticle (hereinafter, simply a "reticle") on the surface of a wafer. The present invention is particularly suitable, in a lithographic process, for efficient illumination of an illumination region of a predetermined shape on the surface of a reticle, enabling production of high density devices.

In the manufacture of semiconductor devices or liquid crystal panels through photolithography, projection exposure apparatuses with projection optical systems are used to transfer a pattern, formed on the surface of a reticle, onto a photosensitive substrate such as a wafer or glass plate having a photoresist coating. Recently, the size of the chip pattern of a single semiconductor device is increasing more and more, and it is desired for projection exposure apparatuses to provide enlarged exposure areas for printing a larger size reticle pattern on a photosensitive substrate.

For enlargement of the area of a pattern to be transferred, there are a projection exposure apparatus of a stitching exposure method and a projection exposure apparatus of a slit scan exposure method.

In the slit scan exposure method, a reticle and a photosensitive substrate are relatively and scanningly moved in a predetermined first direction, in synchronism with each other and relative to an illumination region of a predetermined shape on the reticle, by which a pattern of the reticle is printed through projection exposure upon the range on the photosensitive substrate which is wider than the exposure field of a projection optical system.

In the stitching exposure method, on the other hand, after the exposure process in the first direction according to the procedure of the above-described slit scan exposure method is performed, the reticle is replaced by another or the reticle is moved by a predetermined amount in a second direction perpendicular to the first direction of the illumination region and, simultaneously therewith, the photosensitive substrate is shifted laterally in a direction conjugate with the second direction of the illumination region of the reticle. Then, the reticle and the photosensitive substrate are relatively and scanningly moved again in synchronism with each other and relative to the illumination region, whereby exposure of a second row of the area is performed. As a result, with regard to both of the first and second directions, the pattern of the reticle is printed through projection exposure upon the range on the photosensitive substrate which is wider than the exposure field of the projection optical system.

With the increase in density of a semiconductor device and reduction in size of it, improvement of resolution of a projection optical system has been desired. To meet this, a pulse laser such as an excimer laser is used in exposure apparatuses as a light source of the deep ultraviolet region.

In a scan type exposure apparatus according to a step-and-scan method, for example, having a pulse light emission excimer laser as a light source, if the scan speed or pulse emission timing changes (in a case wherein the light intensity distribution on the mask surface or wafer surface is uniform in the scan direction), there will occur exposure non-uniformness on the mask surface or wafer surface.

Japanese Laid-Open Patent Application, Laid-Open No. 158449/1985 shows an exposure apparatus which solves the above-described problem. According to this document, the light intensity distribution defined on the mask surface or wafer surface has a substantially isosceles trapezoid or isosceles triangle shape, by which precision of synchronism between the scan speed and the pulse oscillation is eased.

This will be explained in more detail with reference to FIGS. 1A–1D. These drawings explain a case wherein a single exposure is made by use of a single pulse, for better understanding. FIGS. 1A and 1B illustrate exposure amounts at different positions in scan direction in cases wherein the light intensity distribution in the scan direction has a rectangular shape and the timing of emission of a second pulse is shifted. On the other hand, FIGS. 1C and 1D illustrate exposure amounts at different positions in the scan direction in cases wherein the light intensity distribution in the scan direction has an isosceles trapezoidal shape and similarly, the timing of emission of a second pulse is shifted.

It is seen from FIGS. 1A–1D that, if the shift of pulse emission timing of laser is of a similar degree, a variation of exposure amount is less in the case of the isosceles trapezoidal shape of the light intensity distribution. While FIGS. 1A–1D relate to examples of single-pulse exposure, in cases wherein the exposure at each position is made by use of plural pulses, there is the same result that the exposure amount non-uniformness with respect to a shift of the pulse emission timing is less in the case of the trapezoidal shape of the light intensity distribution. The shape of the light intensity distribution in the scan direction is not limited to an isosceles trapezoid. Any shape may be used, provided that superposition of distributions assure smaller non-uniformness of exposure amount as in the cases of FIGS. 1A–1D.

Also, with regard to the stitching exposure method in a case wherein a light source comprises a pulse light emission excimer laser, in order to prevent positional deviation in pattern superposition due to movement in the second direction described above, a connection region may be defined which is to be exposed twice by projection exposure of a first slit scan exposure and by projection exposure of a second slit scan exposure. Japanese Laid-Open Patent Application, Laid-Open No. 132195/1994 proposes use of a trapezoidal shape illuminance distribution in the second direction, as described above, to prevent illuminance non-uniformness at the connection portion.

This will be explained in more detail with reference to FIGS. 2A–2C. FIG. 2A illustrates a case wherein a pattern is going to be printed on a portion 121 of a substrate in accordance with a stitching and slit scan exposure method.

Initially, the transfer region is present at a position denoted at 122 in the drawing, and from there the scan is made in a direction s1 toward a position 123. After lateral shift in a direction s2 up to a position 124, scan is made in a direction s3. Here, as described, there is a connection region 125 between the first scan exposure region and the second scan exposure region. Thus, two exposures are made in this connection region 125. If the illuminance distribution in the illumination region has a trapezoidal distribution shape with respect to the stitching direction, as shown in FIG. 2B, non-uniform exposure at the connection region can be prevented whereby a uniform illuminance distribution such as shown in FIG. 2C is produced.

Japanese Laid-Open Patent Application, Laid-Open No. 158449 mentioned hereinbefore uses a light attenuating member such as an ND filter in the path of illumination light to obtain a desired shape of the light intensity distribution in the scan direction. Japanese Laid-Open Patent Application, Laid-Open No. 132195/1994 mentioned above does not suggest a specific structure for obtaining a trapezoidal shape of the illuminance distribution.

SUMMARY OF THE INVENTION

It is an object of the present invention to provide an improved illumination system and/or an improved exposure apparatus by which a non-uniform illuminance distribution such as a trapezoidal shaped illuminance distribution can be produced on the surface to be illuminated.

In accordance with an aspect of the present invention, there is provided an illumination system, comprising: an optical integrator having element lenses arrayed in a direction perpendicular to an optical axis; and an optical system for directing lights from said element lenses of said integrator to a surface to be illuminated; wherein said element lenses include particular element lenses having different optical characteristics which are determined so that upon the surface to be illuminated those lights from said particular element lenses are partly superposed one upon another to provide a non-uniform illuminance distribution on the surface with respect to a predetermined direction.

The illuminance distribution may have a trapezoidal shape, or an isosceles trapezoidal shape with opposed slants of the same length.

The optical characteristics may be determined with respect to a direction of emission of light.

Each of said element lenses of said integrator may include a front-side lens and a back-side lens, wherein predetermined element lenses of said element lenses of said integrator may have their front-side lenses and back-side lenses disposed eccentrically with each other such that lights are projected in directions inclined with respect to the optical axis of said element lenses.

The optical characteristics may concern a numerical aperture.

Said particular element lenses having different optical characteristics may have different aperture diameters.

Said particular element lenses having different optical characteristics may have different focal lengths.

Said element lenses of said integrator may include a convex lens.

Said element lenses of said integrator may include a diffraction optical element.

Said diffraction optical element may comprise a binary type element.

In accordance with another aspect of the present invention, there is provided an exposure apparatus having an illumination system as recited above, for illuminating a mask to project a pattern of the mask onto a substrate.

The exposure apparatus may further comprise scanning means for relatively and scanningly moving the mask and the substrate relative to said illumination system and in a scan direction, wherein the direction in which the non-uniform illuminance distribution is produced may correspond to the scan direction.

The exposure apparatus may further comprise scanning means for relatively and scanningly moving the mask and the substrate relative to said illumination system and in a scan direction, wherein the direction in which the non-uniform illuminance distribution is produced may correspond to each of the scan direction and a direction perpendicular to the scan direction.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A–5C are schematic views, respectively, for explaining central light emitted from a light exit surface of an integrator according to the present invention.

FIGS. 9A through 9C are schematic views for explaining an integrator used in an illumination system according to a fifth embodiment of the present invention.

FIG. 14 is a schematic view of a main portion of an illumination optical system according to an eighth embodiment of the present invention.

FIG. 15 is a schematic view for explaining the portion of the illumination optical system according to the eighth embodiment, from the integrator to the surface to be illuminated.

FIG. 16 is a schematic view for explaining an illumination region and an illuminance distribution, in the eighth embodiment of the present invention.

FIG. 17 is a schematic view for explaining another example an of illuminance distribution, in the eighth embodiment of the present invention.

FIGS. 21A and 21B are schematic views, respectively, for explaining an illumination optical system according to a tenth embodiment of the present invention.

FIG. 22 is a schematic view for explaining a main portion of an illumination optical system according to an eleventh embodiment of the present invention.

FIG. 23 is an enlarged front view of an integrator used in the eleventh embodiment of the present invention.

FIG. 24 is a schematic view of a main portion of an illumination optical system according to a twelfth embodiment of the present invention.

FIGS. 25A and 25B are schematic views, respectively, for explaining an illumination optical system according to a thirteenth embodiment of the present invention.

FIG. 28 is a fragmentary and enlarged front view of a first substrate 12A.

FIG. 31 is a flow chart of device manufacturing processes according to an embodiment of the present invention.

DESCRIPTION OF THE PREFERRED EMBODIMENTS

Figure 3A:
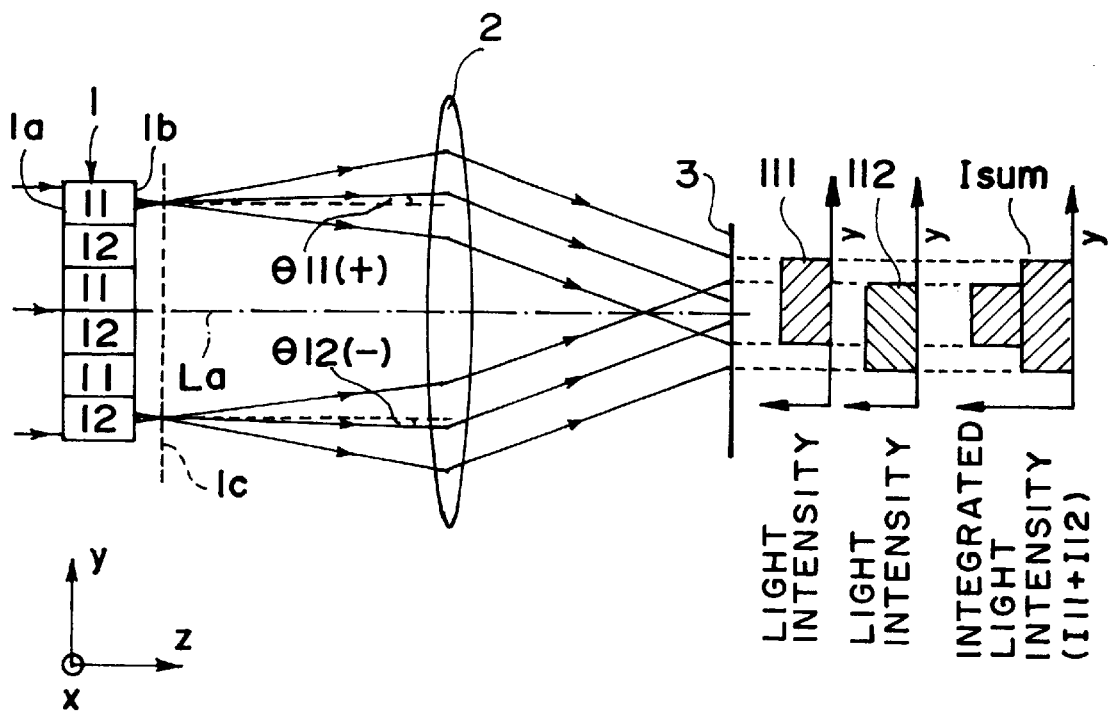
FIGS. 3A and 3B are schematic views, respectively, for explaining an illumination system according to a first embodiment of the present invention.
Figure 3B:
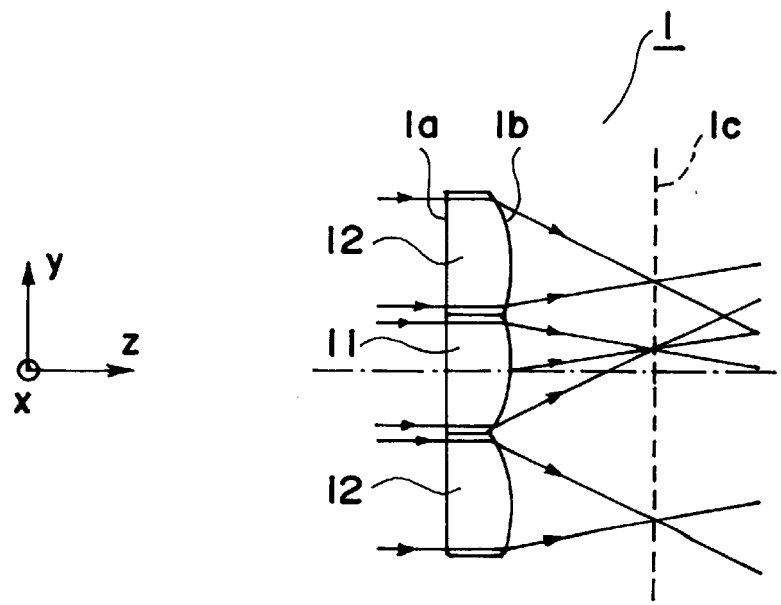

FIG. 3A is a schematic view of a main portion of an illumination system according to a first embodiment of the present invention, and FIG. 3B is an enlarged schematic view of a portion of FIG. 3A.

In FIGS. 3A and 3B, denoted at 1 is an integrator (optical integrator) which comprises a combination of a few types of optical elements (element lenses) 11 and 12, arrayed as illustrated. They are different with respect to the direction of the emission of light, being emitted from the light exit surface 1b, that is, the direction of elongation of the center of light flux emitted (namely, the direction of emission of a central light ray). Light from a light source means (not shown) impinges on the light entrance surface 1a of the integrator 1, and plural secondary light sources are defined at a position 1c adjacent to the light exit surface 1b. Denoted at 2 is a condenser lens which is a component of an illumination optical system. It serves to collect lights from the secondary light sources, defined at the position 1c near the light exit surface 1b of the integrator 1, so that these lights are partly superposed one upon another on the surface 3 to be illuminated, whereby an illumination region of a desired illuminance distribution (light intensity distribution) can be defined.

The integrator 1 of this embodiment may be provided by two types of element lenses 11 and 12 which are different in the direction of emission of light being emitted from the light exit surface 1b, with respect to the input light entered from the light entrance surface 1a. The element lenses 11 serve to emit light so that the center of light defines an angle $\theta_{11}$ with respect to the optical axis La of the whole system, while the element lenses 12 are arranged to emit light so that the center of light defines an angle $\theta_{12}$ similarly. Here, the gravity center position of light at the plane of each secondary light source differs from the array of the element lenses 11 and 12, constituting the integrator 1. Hereinafter, the angle $\theta_{11}$ will be described as upward (+) while the angle $\theta_{12}$ will be described as downward (−).

Figure 1A:
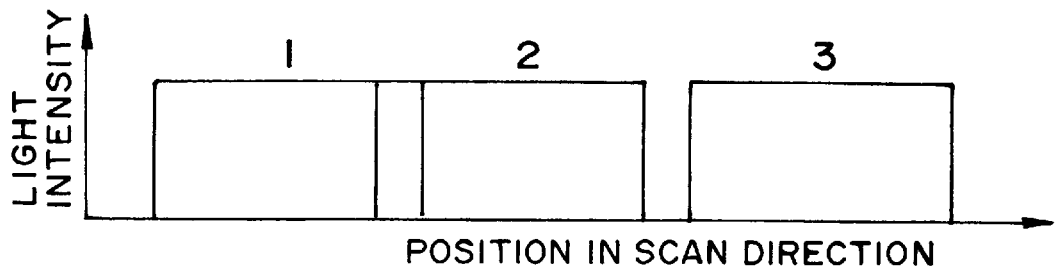
FIGS. 1A–1D are schematic views, respectively, for explaining exposure non-uniformness which can be produced in scan type exposure apparatuses.
Figure 1B:
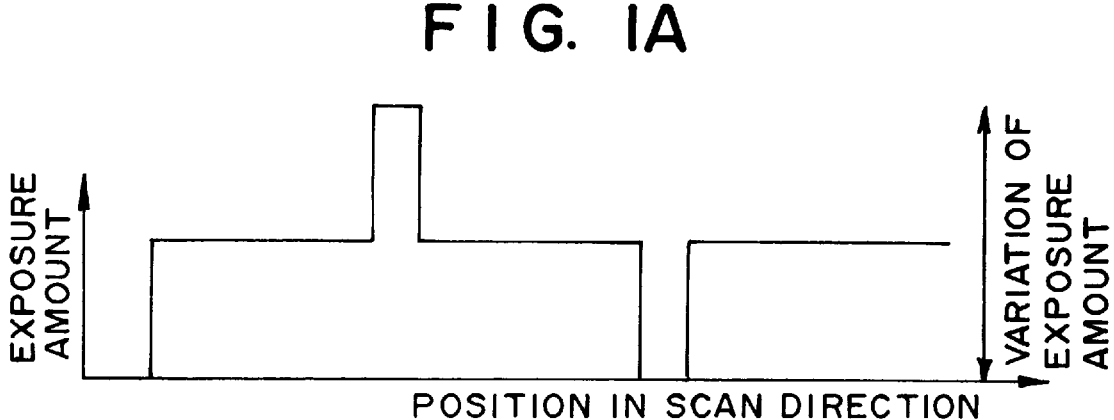
Figure 1C:
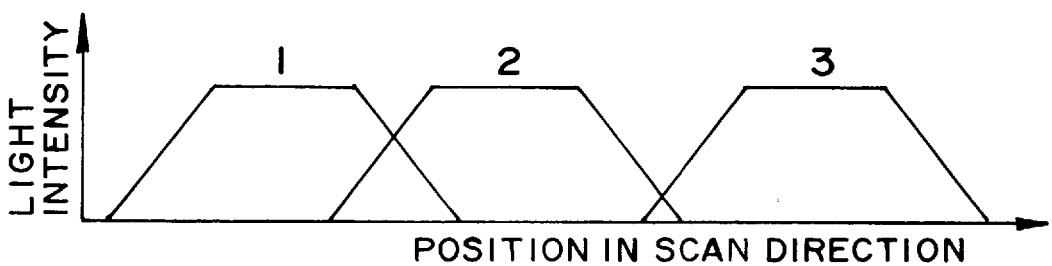
Figure 1D:
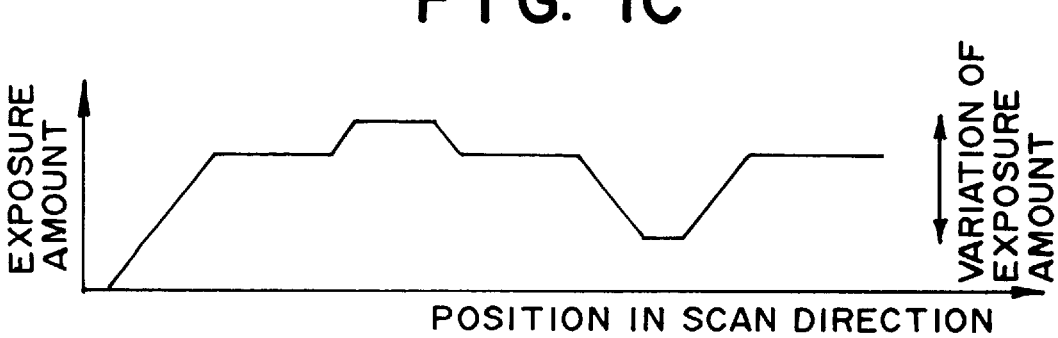
Figure 2A:
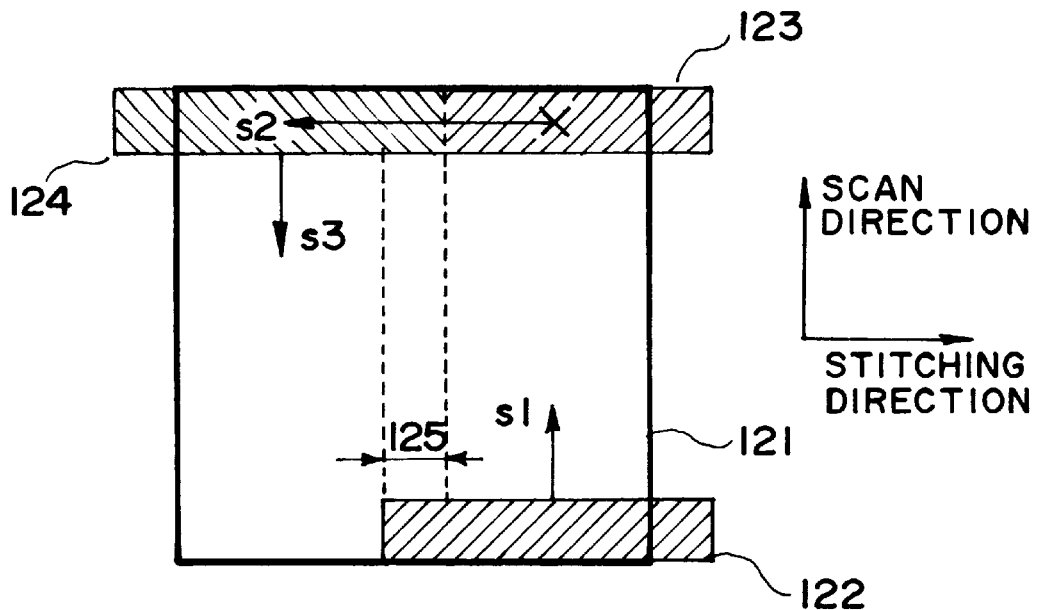
FIGS. 2A–2C are schematic views, respectively, for explaining exposure non-uniformness which can be produced in scan type exposure apparatuses for performing scan exposure with a trapezoidal light intensity distribution.
Figure 2B:
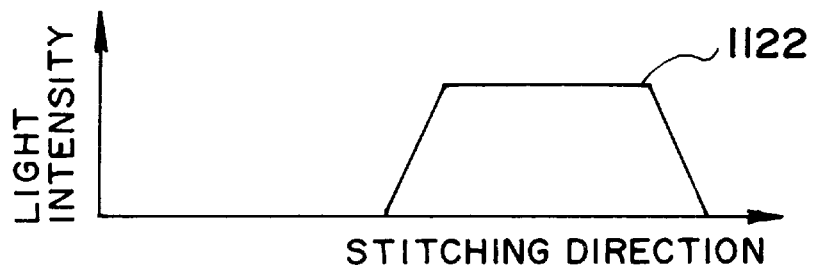
Figure 2C:
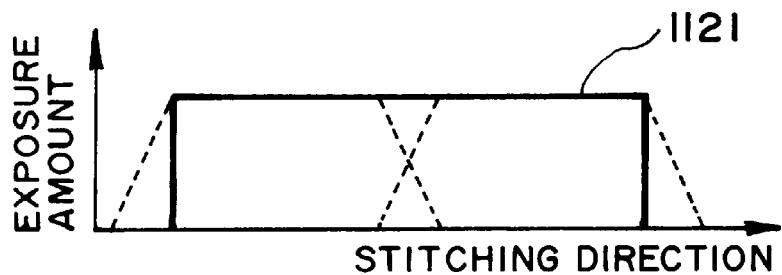

In FIG. 3A, the light emitted from the element lens 11 passes through the condenser lens 2 and it defines on the surface 3 an illumination region having an intensity distribution $I_{11}$. Similarly, the light emitted from the lens element 12 passes through the condenser lens 2 and it defines on the surface 3 an illumination region having an intensity distribution $I_{12}$. Since the intensity distribution $I_{11}$ and the intensity distribution $I_{12}$ are formed at different positions on the surface 3, being illuminated, there is defined on the surface 3 an integrated light intensity distribution $I_{sum}$ provided by the intensity distributions $I_{11}$ and $I_{12}$. As seen in FIG. 1A, the resultant light intensity distribution comprises an approximately dual-stage shape with a stepped distribution.

The integrator 1 may have element lenses of different types of a number larger than two. When light intensity distributions provided by them are superposed one upon another on the surface 3 being illuminated, the resultant integrated light intensity distribution will have a smooth curve, such that an intensity distribution of a trapezoidal shape can be produced.

Figure 4:
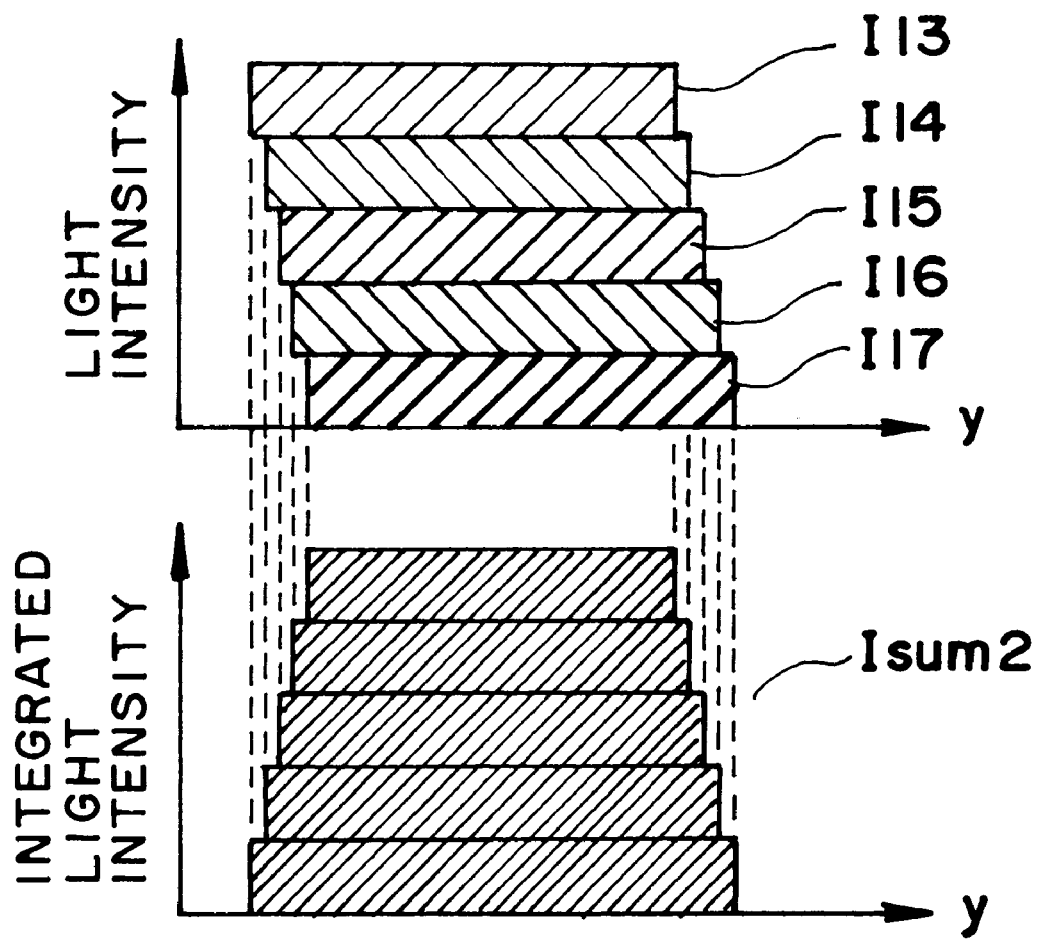
FIG. 4 is a schematic view for explaining an example of a trapezoidal illuminance distribution in the present invention.

FIG. 4 illustrates an example of a light intensity distribution formed on the surface 3, in a case wherein the integrator 1 of this embodiment comprises five types of element lenses which are different from each other in the direction of emission of light being emitted. It is seen in FIG. 4 that an illuminance distribution of a shape closely like a trapezoid can be provided in this example, as compared with the FIG. 3A example. It is to be noted that in FIGS. 3A and 4, the light intensity distribution on the surface being illuminated changes in the Y direction.

When the illumination system of this embodiment is incorporated into a scan type exposure apparatus, the Y direction may be set as a scan direction or a stitching direction, or, alternatively, it may be set in both of them. With respect to the sectional plane with respect to which a desired light intensity distribution is required, an integrator with element lenses which are different in the direction of light emission may be used in compliance with the structure of the exposure apparatus.

FIGS. 5A, 5B and 5C are schematic views, respectively, for explaining examples in this embodiment where, when the light which is incident on the light entrance surface 31a of one element lens 31 of the integrator 1 emerges out of the light exit surface 31b, the direction of emission of the light differs from the direction of the incidence of light (i.e., optical axis 31c).

FIG. 5A shows an ordinary element lens 31 having its entrance side lens surface and exit side lens surface disposed coaxial, such that the direction of emission of central light 31d emitted does not shift. In this case, the direction of emission of central light 31d is aligned with the direction of incidence (z axis) 31c of the input light being introduced.

FIG. 5B shows an example wherein the element lens 31 shown in FIG. 5A is divided into two lens portions 321 and 322 in the direction of an optical axis 31c, and the exit side lens portion 322 is shifted by a predetermined amount in a direction (Y-axis direction) perpendicular to the optical axis 31c.

FIG. 5C shows another example wherein the element lens 31 shown in FIG. 5A is divided into two element lens portions 331 and 332, with a predetermined angle with respect to the optical axis 31c, and the exit side element lens portion 322 is tilted in the Y-axis direction by a predetermined amount.

In the examples of FIGS. 5B and 5C, when the light impinging on the light entrance surface 31a of the element lens 31 emerges out of the light exit surface 31b, the central ray 31d of it is projected in a direction of emission deviated from the direction of light incidence (Z-axis direction).

This embodiment may use different types of element lenses which are different from each other with respect to the direction of or amount of shift at the element lens portion 322 or with respect to the direction of or amount of tilt at the element lens portion 333, thereby to control the tilt or the amount of tilt of the emission direction of central ray 31d, in various ways as desired. For example, five types of element lenses which are different with respect to the amount of shift may be used in combination, and plural combinations of these element lenses may be arrayed in the Y direction to provide a light intensity distribution such as shown in FIG. 4, for example.

In the examples of FIGS. 5B and 5C, the element lens 31 is provided by a single lens and, by cutting a portion thereof, it is divided into two lens portions. Then, one of them is shifted eccentrically. However, each of the element lenses 31 constituting the integrator 1 may be provided by a single lens and these element lenses may be disposed eccentrically with respect to the optical axis La of the illumination optical system, such that the directions of emission of central rays passing these element lenses may differ from each other. Further, in the examples of FIGS. 5B and 5C, each of the lens portions 321 and 322 or each of the lens portions 331 and 333 may be provided by an independent single lens. Alternatively, the lens portions 321 and 322 (or 331 and 333) may be provided by an integral structure produced by molding. Such modifications described above may apply similarly to other embodiments of the present invention to be described later.

Figure 6:
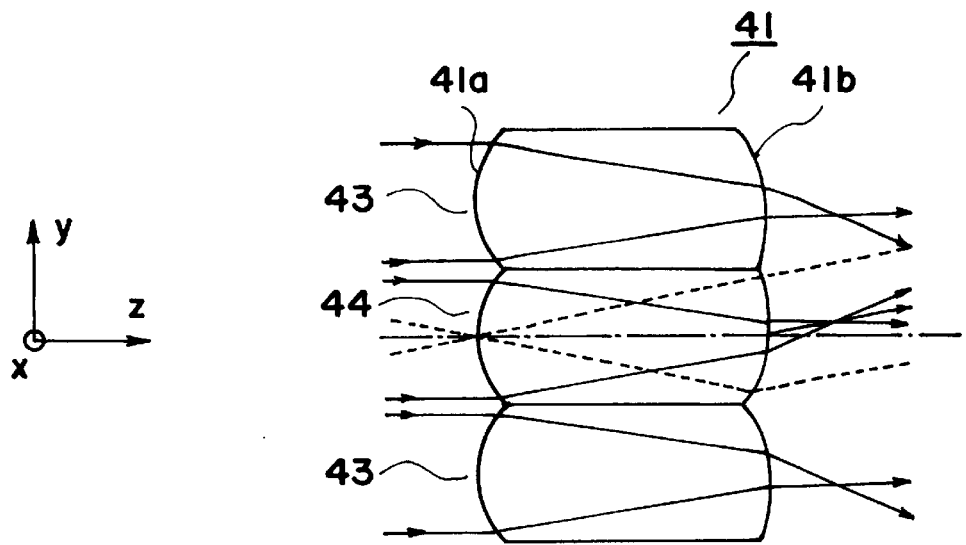
FIG. 6 is a schematic view for explaining an integrator used in an illumination system according to a second embodiment of the present invention.
Figure 7:
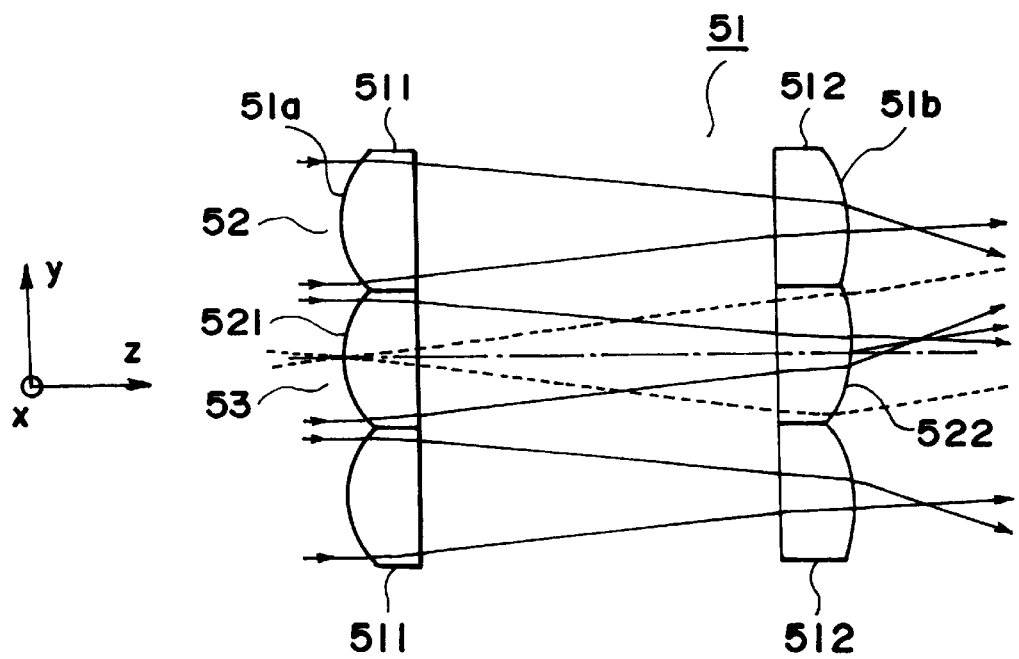
FIG. 7 is a schematic view for explaining an integrator used in an illumination system according to a third embodiment of the present invention.

FIGS. 6 and 7 are schematic views, respectively, of a main portion of an integrator which may be used in an illumination system according to a second or third embodiment of the present invention. In the second and third embodiments to be described below, the components other than the integrator 41 or 51 may have the same structure as those of the first embodiment shown in FIGS. 3A and 3B.

In the second embodiment shown in FIG. 6, the integrator 41 is provided by using two element lenses 43 and 44 in a pair, which are different from each other with respect to the direction of emission of a central light ray from the light exit surface 41b of the integrator 41, wherein a plurality of such pairs are disposed in an array along the Y-axis direction. In the example shown in FIG. 6, the exit side lens surfaces are formed with eccentricity with respect to the entrance side lens surfaces. Various factors such as refracting power at the exit surface or refracting power of the condenser lens, for example, are so set that the light entrance surface 41a of the integrator 41 is disposed in a positional relation optically conjugate with the surface 3 to be illuminated. The entrance side lens surfaces of the element lenses may have the same shape.

In the third embodiment shown in FIG. 7, the element lens 52 (53) is provided by two lens portions 511 and 512 (521 and 522), and plural pairs of such lens portions are disposed along the Y-axis direction. The exit side lens portions 512 and 522 are disposed with eccentricity with respect to the entrance side lens portions 511 and 521, such that in these element lenses the directions of emission of central light rays from the exit side 51b are different from each other. Various factors such as refracting power at the exit side lens portion or refracting power of the condenser lens, for example, are so set that the lens surface at the entrance side 51a is disposed in a positional relation optically conjugate with the surface 3 to be illuminated. The entrance side lens portions 511 and 521 may have the same shape.

Figure 8A:
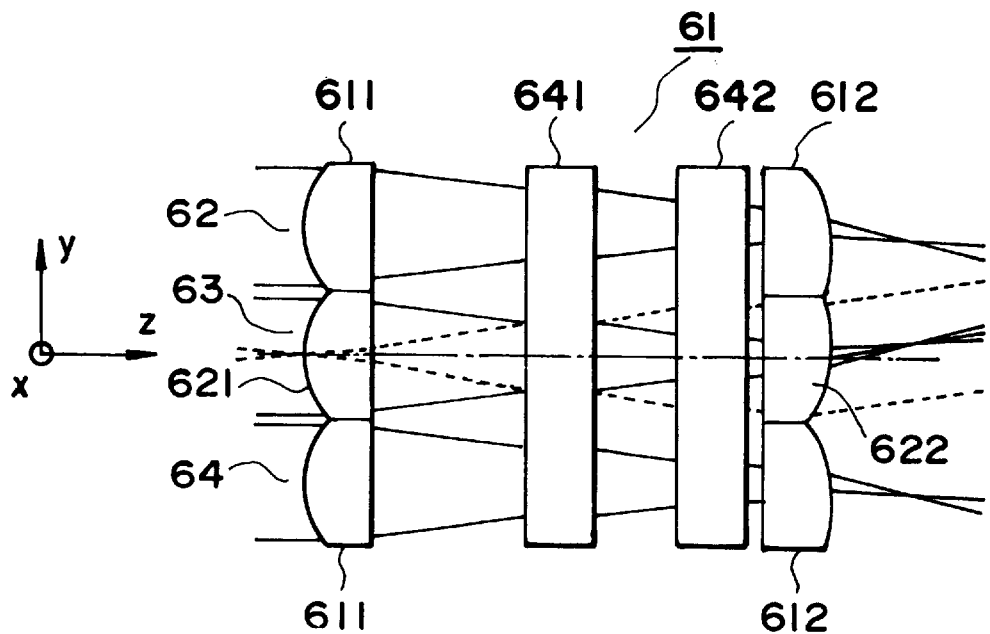
FIGS. 8A and 8B are schematic views, respectively, for explaining an integrator used in an illumination system according to a fourth embodiment of the present invention.
Figure 8B:
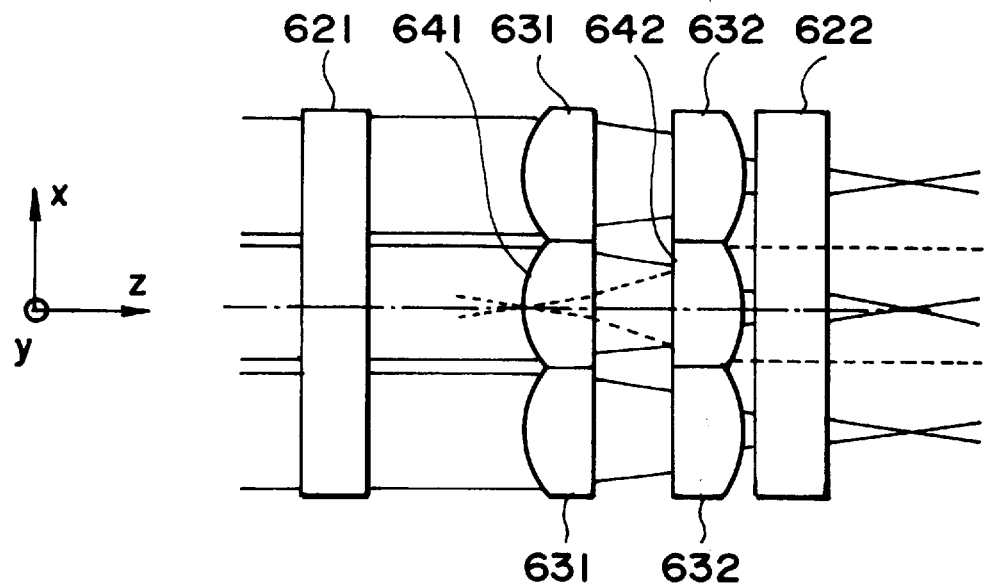

FIGS. 8A and 8B are schematic views, in section along the Y-Z section and X-Z section, respectively, of an integrator which may be used in a fourth embodiment of the present invention. Components other than the integrator may have the same structure as those of the first embodiment of FIGS. 3A and 3B.

In this embodiment, the integrator 61 is provided by plural element lenses 62, 63 and 64 and, in the illustrated example, one of the element lenses is constituted by four cylindrical lenses.

Cylindrical lenses are used as components of the element lens, and the numerical aperture of emitted light in the Y direction differs from that in the X direction. With this arrangement, the surface 3 can be illuminated in the rectangular (slit-like) shape. Cylindrical lenses 611, 612, 621 and 622 have a refracting power in the Y-Z section, and the surfaces at the exit side have eccentricity. Thus, element lenses 62 and 63 which are different with respect to the direction of emission of a central light ray from the light exit surface are provided. Cylindrical lenses 641, 642, 631 and 632 have a refracting power in the X-Z section, and they are coaxial with each other. Thus, the direction of emission of a central light ray is the same as the direction of light as projected on the integrator.

The element lenses 62, 63 and 64 are disposed so that their light convergence points are placed substantially on the same plane which is perpendicular to the Z axis. Also, the light entrance surfaces of the element lenses are optically conjugate with the surface 3 to be illuminated. Cylindrical lenses 611 and 612 may have the same structure.

FIG. 9A is a schematic view of a main portion of an integrator 71 which may be used in an illumination system according to a fifth embodiment of the present invention. FIGS. 9B and 9C are schematic views, respectively, for explaining the light entrance side and the light exit side in the illustration of FIG. 9A. Components other than the integrator 71 may have the same structure as those of the first embodiment shown in FIGS. 3A and 3B.

In FIGS. 9A–9C, denoted at 721, 722, 711 and 712 are diffraction optical elements. Among them, the diffraction optical elements 721 and 722 (or 711 and 712) constitute a single element lens 72 (or 73). In the illustrated example, small diffraction optical elements 711 and 721 are provided on the object side surface (light entrance side surface) 71a of a substrate 70. Also, small diffraction optical elements 712 and 722 are provided on the image side surface (light exit side surface) 71b. The diffraction optical elements 711 and 712 as well as the diffraction optical elements 721 and 722 are used in combination, to provide element lenses 72 and 73 which are different from each other with respect to the direction of emission of a central light ray.

As best seen in FIG. 9B, each of the diffraction optical elements 711 and 721 has a pattern of concentric circles disposed more tightly in the peripheral portion and having an optical function equivalent to that of a spherical lens having no eccentricity. The diffraction optical elements 711 and 721 may have the same structure.

As best seen in FIG. 9C, the diffraction optical elements 712 and 722 have a pattern of concentric circles which are shifted in Y direction to provide different directions of light emission. The center of the concentric circles is placed at a position shifted from the center of the concentric circles of the associated diffraction optical element at the object side, being used in a pair.

In this embodiment, the element lens 72 serves to emit light with an upward tilt while the element lens 73 serves to emit light with a downward tilt. Also, the light entrance surfaces of the element lenses are placed in an optically conjugate relation with the surface 3 to be illuminated.

While the integrator 71 of this embodiment is provided by using diffraction optical elements placed before and after a single substrate 70, plural substrates of a size that can be produced may be used in combination to provide an integrator of a desired size as a whole. Further, in place of using diffraction optical elements before and after a single substrate 70, these optical elements may be provided on separate substrates. Since the diffraction optical element may be provided by a number of patterns of the same structure disposed in an array on the same plane, preferably it may be produced as a binary element by using lithographic processes. On that occasion, from the standpoint of efficiency of light utilization, one that provides a number of stages (step levels) of four or more may be preferable.

Figure 10A:
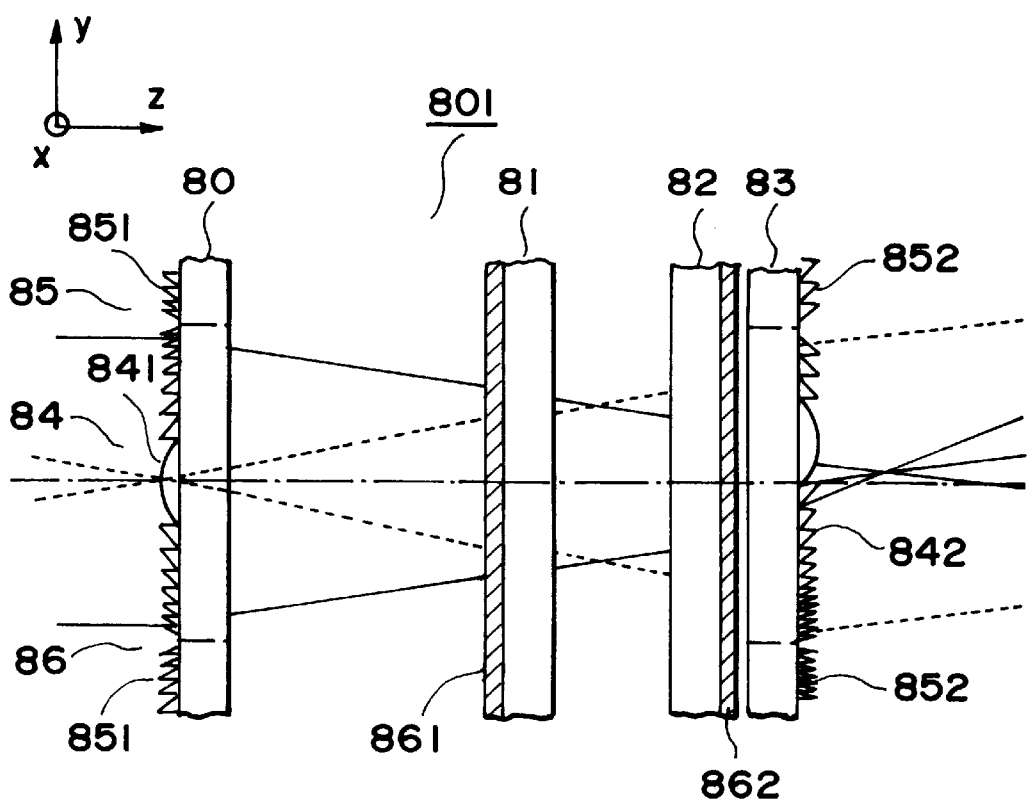
FIGS. 10A and 10B are schematic views, respectively, for explaining an integrator used in an illumination system according to a sixth embodiment of the present invention.
Figure 10B:
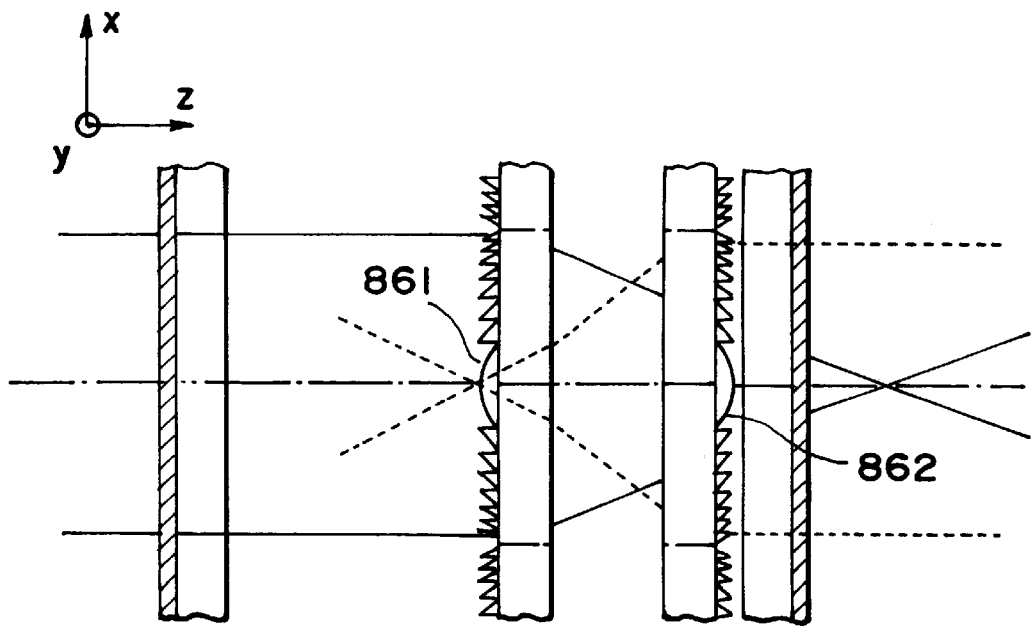

FIGS. 10A and 10B are schematic views, in section along the Y-Z section and X-Z section, respectively, of an integrator which may be used in a sixth embodiment of the present invention. Components other than the integrator 801 may have the same structure as those of the first embodiment of FIGS. 3A and 3B.

Figure 11A:
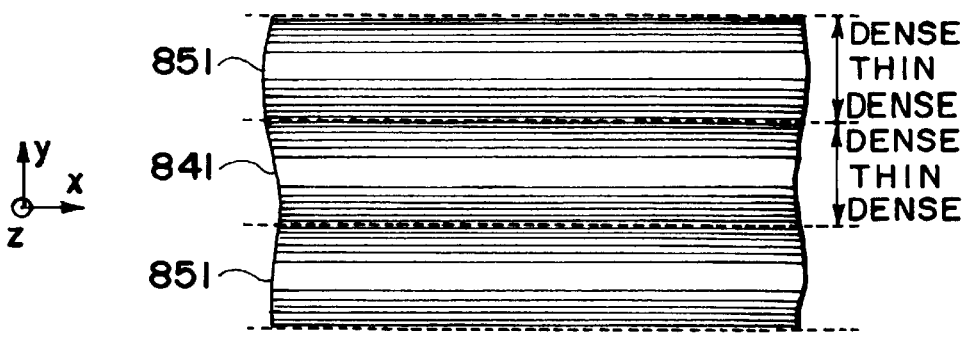
FIGS. 11A–11D are schematic views, respectively, for explaining an integrator used in an illumination system according to a sixth embodiment of the present invention.
Figure 11B:
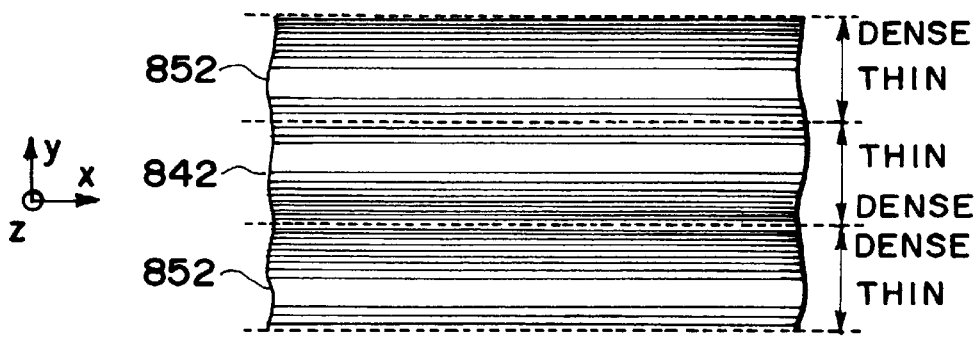

Denoted in FIGS. 10A and 10B at 841, 851, 842 and 852 are diffraction optical elements having a structure such as shown in FIGS. 11A and 11B. Diffraction optical elements 841 and 842 (851 and 852) constitute a single element lens. Denoted at 861 and 862 are diffraction optical elements having a structure such as shown in FIGS. 11C and 11D.

This embodiment uses, as an element lens, a diffraction optical element having a power only in a one-dimensional direction, like a cylindrical lens, and the numerical aperture of emitted light in the Y direction differs from that in the X direction. With this structure, the surface to be illuminated can be illuminated in rectangular shape. Diffraction optical elements 841 and 851 are provided on the object side surface of a substrate 80, while the diffraction optical elements 842 and 852 are provided on the image side of a substrate 83. With the combination of diffraction optical elements 841 and 842 and the diffraction optical element 851 and 852, elements lenses 84 and 85 having a power in the Y-Z section are provided. These element lenses are different from each other with respect to the direction of emission within the Y-Z section.

As seen in FIGS. 11A and 11B, each of the diffraction optical elements 841 and 851 has arrayed rectilinear patterns extending in the X direction. These patterns are loosest at the central portion, and they become closer (providing a larger power or refracting power) in peripheral portions away from the center, upwardly and downwardly in the Y direction. The diffraction optical elements 841 and 851 may have the same structure. Similarly, each of the diffraction optical elements 842 and 852 has arrayed rectilinear patterns extending in the X direction. A loose pattern portion is shifted in the Y direction. In directions away from the loose pattern portion upwardly and downwardly, the patterns become closer and the power becomes stronger.

Figures 11C, 11D:
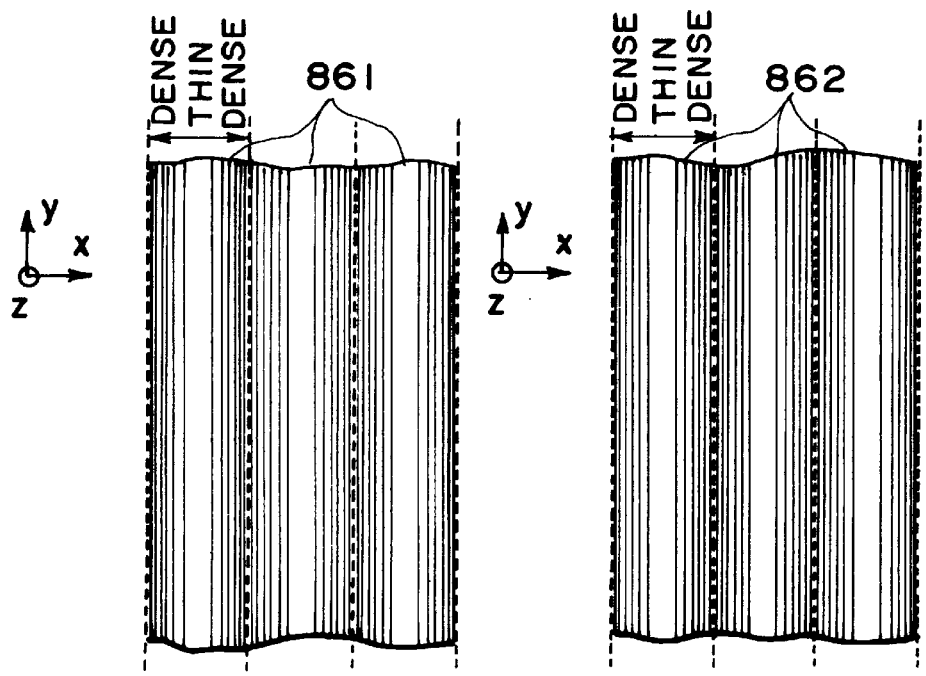

Diffraction optical element 861 such as shown in FIG. 11C is provided on the object side surface (light source side surface) of a substrate 81, while the diffraction optical element such as shown in FIG. 11D is provided on the image side surface (mask side surface) of another substrate 82. These diffraction optical elements are combined to provide an element lens 86 having a power in the X-Z section. It is arranged so that the central light ray emits in the same direction as the optical axis of the input light projected thereon. As shown in FIGS. 11C and 11D, each of the diffraction optical elements 861 and 862 has arrayed rectilinear patterns extending in the Y direction. The patterns are loosest at the central portion, and in the directions along the X direction away from the center leftwardly and rightwardly the patterns become closer and the power becomes stronger.

The element lenses 84, 85 and 86 are so arranged that their light convergence points are placed substantially on the same plane which is perpendicular to the Z axis. Also, the light entrance surfaces of the element lenses are optically conjugate with the surface 3 to be illuminated.

Figure 12A:
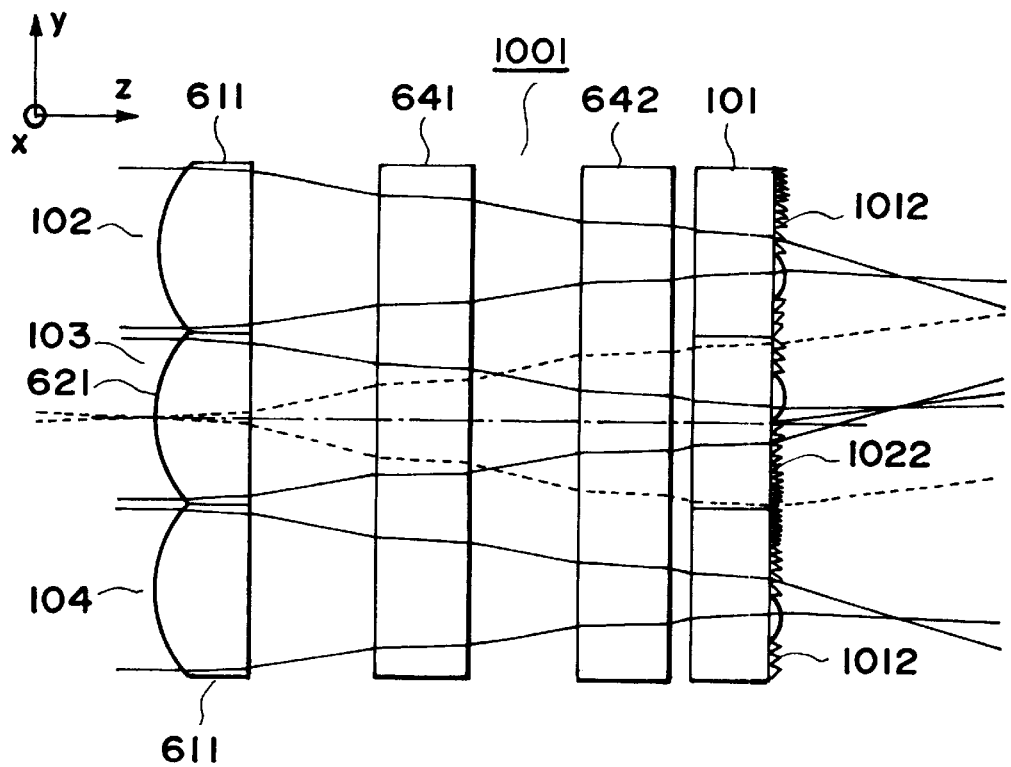
FIGS. 12A and 12B are schematic views for explaining an integrator used in an illumination system according to a seventh embodiment of the present invention.
Figure 12B:
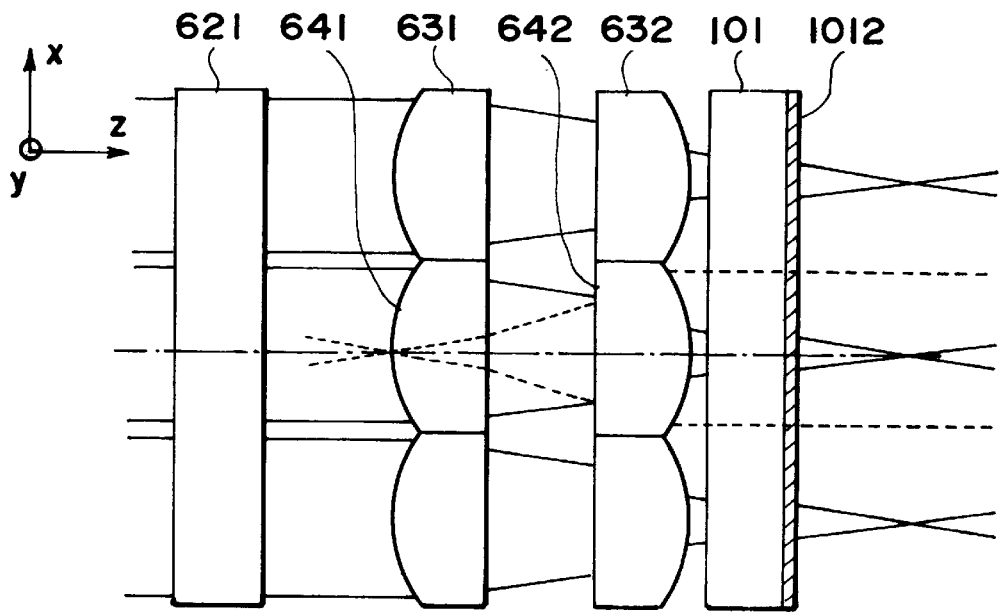

FIGS. 12A and 12B are schematic views, in section along the Y-Z section and X-Z section, respectively, of an integrator which may be used in a seventh embodiment of the present invention. Components other than the integrator 1001 may have the same structure as those of the first embodiment of FIGS. 3A and 3B.

In this embodiment, the cylindrical lenses 612 and 622 of the fourth embodiment shown in FIG. 8A are replaced by diffraction optical elements 1012 and 1022 having a power in the Y-Z section. As an example, one element lens 103 may be provided by three cylindrical lenses 621, 641 and 642 and a diffraction optical element 1022.

In this embodiment, three ordinary cylindrical lenses and a diffraction optical element having a power such as a cylindrical lens are used in combination to provide one element lens, and the numerical aperture of emitted light in the Y direction differs from that in the X direction. With this arrangement, the surface to be illuminated can be illuminated in a rectangular (slit-like) shape. A combination of cylindrical lens 611 and diffraction optical element 1021 as well as a combination of cylindrical lens 621 and diffraction optical element 1022 provide element lenses 102 and 103 having a power in the Y-Z section. These element lenses are different from each other with respect to the direction of emission of a central light ray in the Y-Z section.

Like the structure shown in FIG. 11B, each of the diffraction optical elements 1012 and 1022 has arrayed rectilinear patterns extending in the X direction. Similarly, a loose pattern portion of the array is shifted in the Y direction. In directions away from the loose portion upwardly and downwardly, the patterns become closer and the power becomes stronger.

The element lenses 102, 103 and 104 are so disposed that their light convergence points are placed substantially on the same plane which is perpendicular to the Z axis. Also, the light entrance surfaces of the element lenses are optically conjugate with the surface 3 to be illuminated. While in the illustrated example the cylindrical lens is replaced by a diffraction optical element having a similar power, the spherical surface lenses 511 and 512 shown in FIG. 7 may be replaced by diffraction optical elements.

Figure 13:
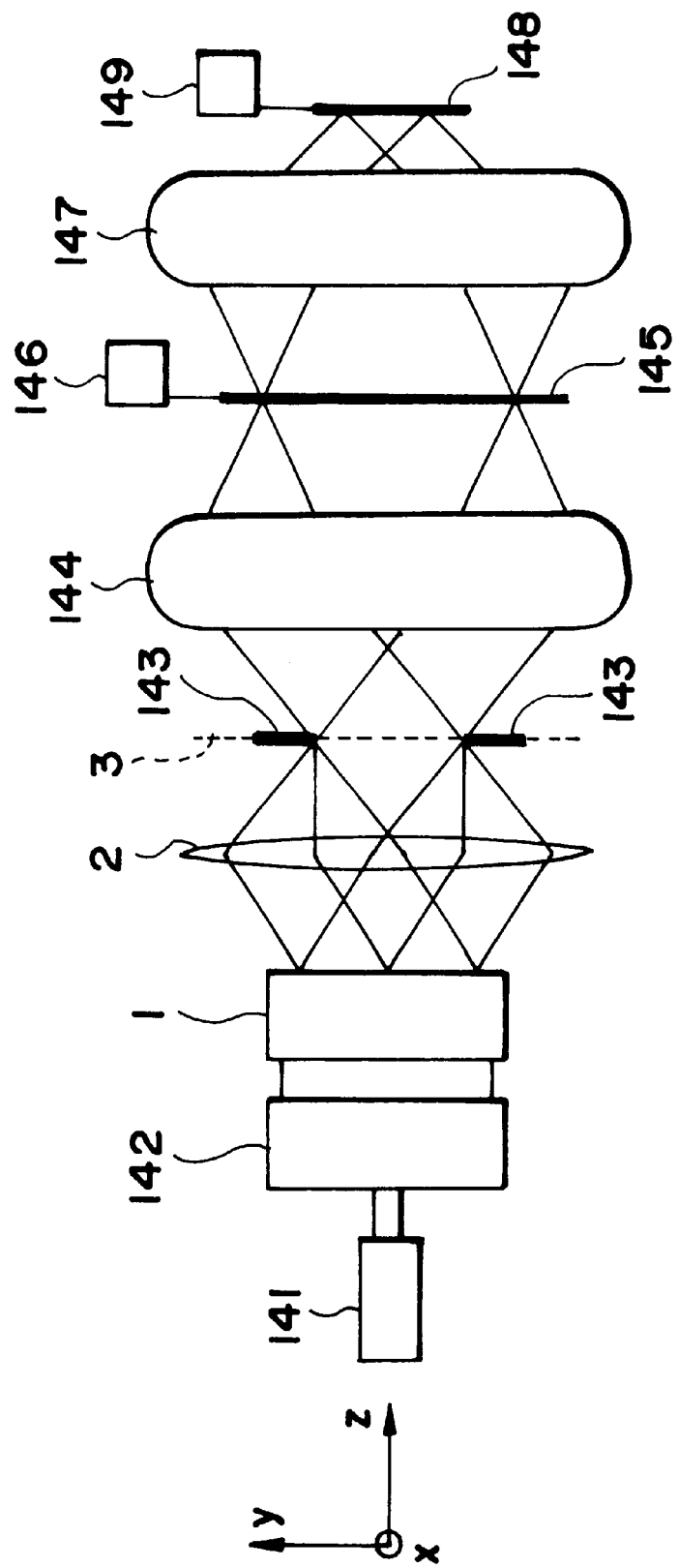
FIG. 13 is a schematic view of a main portion of a projection exposure apparatus according to an embodiment of the present invention.

FIG. 13 is a schematic view of a main portion of an embodiment of a projection exposure apparatus which uses one of the illumination systems according to the preceding embodiments. Denoted in FIG. 13 at 141 is a light source, and denoted at 142 is a beam shaping optical system. Denoted at 1 is an integrator, and denoted at 2 is a condenser lens. These components may have the same structure as those of the illumination system shown in FIG. 3A.

Denoted at 143 is a stop which is disposed at the position of the surface 3 (FIG. 3A) to be illuminated. Denoted at 144 is a stop imaging lens for projecting the aperture shape of the stop 143 onto a reticle 145 which is disposed on the surface to be illuminated. There is an illumination region on the reticle 145 surface, which has an analogous shape as the aperture shape of the stop 143. Denoted at 147 is a projection lens (projection optical system) for projecting a pattern formed on the reticle 145 surface onto the surface of a photosensitive substrate (wafer) 148. Denoted at 146 is driving means for moving the reticle 145, and denoted at 149 is another driving means for moving the wafer 148.

In this embodiment, a circuit pattern formed on the reticle 145 is projected and printed onto the wafer 148 being coated with a photosensitive material such as a resist, with projection exposure through the projection lens 147 and in accordance with the step-and-scan method or with the stitching-and-scan method. If, for example, the exposure apparatus is of the step-and-scan method, the whole pattern of the reticle 145 is not illuminated at once, but there is an illumination area a slit-like shape, defined. A portion of the pattern of the reticle 145 placed within this illumination area is projected by the projection lens 147 onto an exposure area on the wafer 148.

The reticle 145 is mounted on a reticle stage, and it can be scanningly moved by the driving means 146 in the X direction, for example. The wafer 148 is placed on a movable stage which can be scanningly moved by the driving means 149 in an opposite direction along the X direction (e.g., the negative X direction) to the reticle 145 movement. The reticle 145 and the wafer 148 are thus scanningly moved in opposite directions in synchronism with each other, at a speed ratio corresponding to the projection magnification of the projection lens 147. On the basis of the projection exposure apparatus as described, the pattern of the reticle can be printed on the substrate with an illumination region having a desired light intensity distribution.

Figure 18:
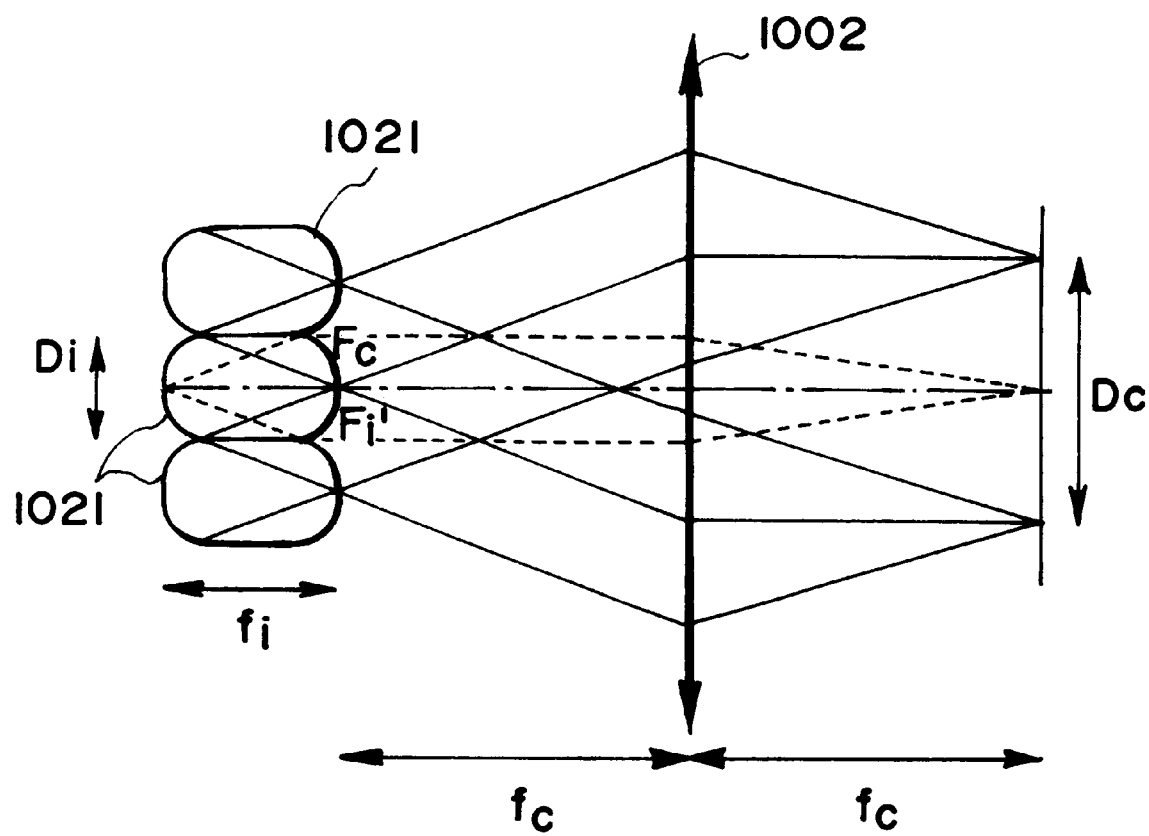
FIG. 18 is a schematic view for explaining the relationship between element lenses and a condenser lens.

Now, for a better understanding of other embodiments of the present invention, reference may be made to FIG. 18 to explain the relation between element lenses of an optical integrator and a condenser lens.

In FIG. 18, denoted at 1021 are element lenses of an integrator, each having a focal length $f_i$ and a numerical aperture $D_i$. These element lenses are disposed in an array, and a secondary light source plane can be defined at the position of a rear focal point $F_i'$ of the element lens.

Condenser lens 1002 having a focal length $f_c$ is disposed so that its front focal point $F_c$ is placed substantially on the secondary light source plane, and the rear focal point of the condenser lens 1002 is placed substantially on the surface to be illuminated. Thus, what can be called a Koehler illumination system is provided.

With regard to the illumination width $D_i$ on the surface being illuminated, there is a relation as follows:

$$D_c = D_i f_c / f_i \tag{1}$$

Thus, by changing the aperture width $D_i$ or the focal length $f_i$ of the element lens 1021, the illumination width $D_i$ can be adjusted.

FIG. 14 is a schematic view of a main portion of an illumination optical system according to an eighth embodiment of the present invention. Denoted in the drawing at 1031 is a light source which comprises, in this example, a pulse emission type laser. Denoted at 1032 is a beam shaping optical system which serves to transform the light from the light source 1031 into light of a desired diameter. Denoted at 1033 is exposure amount adjusting means which serves to adjust the amount of exposure on a wafer, not shown, with the illumination optical system. Denoted at 1001A is an optical integrator which comprises a plurality of element lenses by which plural secondary light sources are defined at the light exit surface thereof. Denoted at 1002 is a condenser lens which serves to Koehler-illuminate a surface 1003, to be illuminated, with use of lights from the element lenses. The surface 1003 may be a surface which is going to be illuminated, or it may be a masking surface.

In operation of this embodiment, light emitted from the light source 1031 is transformed by the beam shaping optical system 1032 into light of a desired beam diameter. By way of the exposure amount adjusting means 1033, the light enters the integrator 1001A. Then, lights from the element lenses constituting the integrator 1001A are projected through the condenser lens 1002 onto the surface 1003. Here, the lights from the element lenses or at least central portions of them including their central light rays are partly and roughly superposed one upon another on the surface 1003, whereby an illumination region is defined on the surface 1003 with a desired illuminance distribution.

FIG. 15 is a schematic view of a portion of the illumination optical system according to the eighth embodiment, from the integrator 1001A to the surface 1003. The present embodiment will be described in more detail with reference to FIG. 15. Here, for the illumination optical system, an orthogonal X-Y-Z coordinate system having the Z axis taken on the optical axis of the condenser lens is set, wherein the Y-Z section will be referred to as a first section, and the X-Z section will be referred to as a second section.

The integrator 1001A comprises three types of element lenses 1101, 1102 and 1103 having different focal lengths, which are disposed in an array along the X-Y section. The element lens 1101 has a longest focal length, while the element lens 1103 has a shortest focal length. These element lenses have entrance side apertures (sections) of a square shape of the same size.

The light entrance surfaces of the element lenses are optically conjugate with the surface 1003 to be illuminated. Thus, by means of the element lenses, illumination regions of a shape analogous to the aperture shape (square) of the element lenses are defined on the surface 1003. Here, the centers of these illumination regions are at the position where the central light rays as depicted by broken lines in the drawing intersect with the surface 1003 and thus they are at a common point. Also, as seen from equation (1), the size of a illumination region is smaller with a larger focal length of the element lens, and it is larger with a smaller focal length.

FIG. 16 is a schematic view for explaining illumination regions and an illuminance distribution which can be defined on the surface 1008, in the eighth embodiment. In the drawing, denoted at s1101 is an illumination region defined by the element lens 1101. Similarly, denoted at s1102 and s1103 are illumination regions defined by the element lenses 1102 and 1103, respectively.

On the surface 1003 to be illuminated, these illumination regions are superposed whereby an illuminance distribution having an X-axis section and a Y-axis section such as illustrated in FIG. 16 is provided. In this example, an illuminance distribution of an approximately trapezoidal shape both in the X and Y axes is produced.

Since it is desirable to provide a uniform numerical aperture on the surface 1003 to be illuminated, distributions of the element lenses of the integrator may desirably be disposed with a uniform dispersion. This applies to other embodiments to be described later.

Since the shape of the trapezoidal illuminance distribution is determined on the basis of the types of element lenses and the sum of the areas of entrance side apertures of them, these factors may be determined in accordance with the illuminance distribution shape as desired.

Therefore, while three types of element lenses are used in this embodiment, the number of types may be increased or decreased as required.

While the entrance side aperture of the element lens has a square shape in this embodiment, it may have an oblong shape or a hexagonal shape. FIG. 17 shows an illuminance distribution on the surface 1003 when each element lens has an aperture of an oblong shape.

In this case, the element lens has an aperture of an oblong shape wherein the size in the Y direction is smaller than the size in the X direction. An illumination region of a shape analogous to it is formed on the surface 1003.

In illumination optical systems according to some embodiments of the present invention to be described later, chief rays of lights from element lenses will be depicted by broken lines in the drawings, and the position where these chief rays intersect the surface 1003 to be illuminated will be the same for all these embodiments.

Figure 19A:
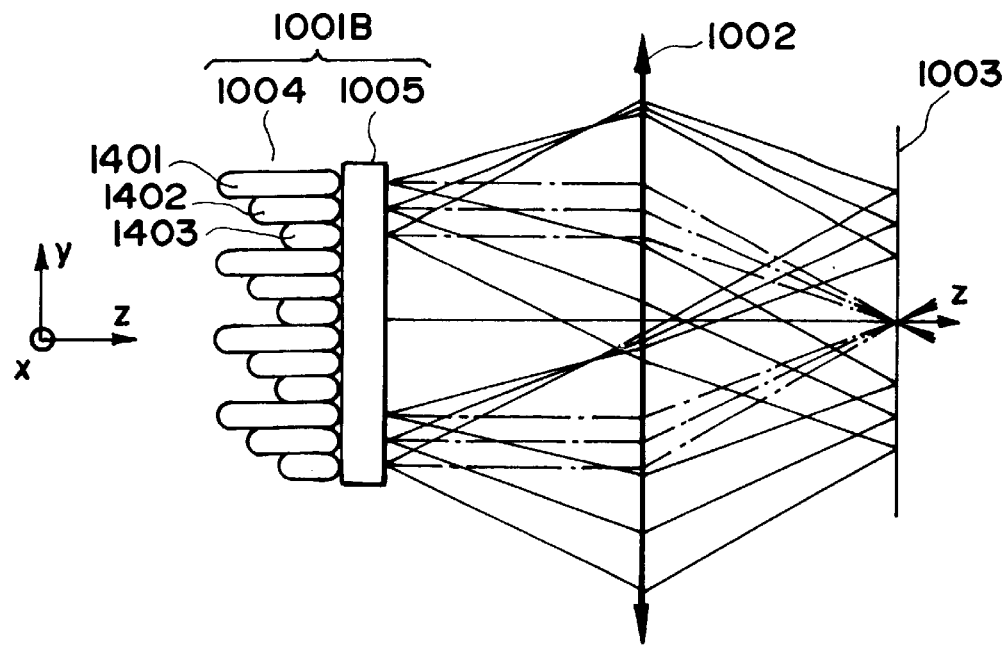
FIGS. 19A and 19B are schematic views for explaining a main portion of an illumination optical system according to a ninth embodiment of the present invention.
Figure 19B:
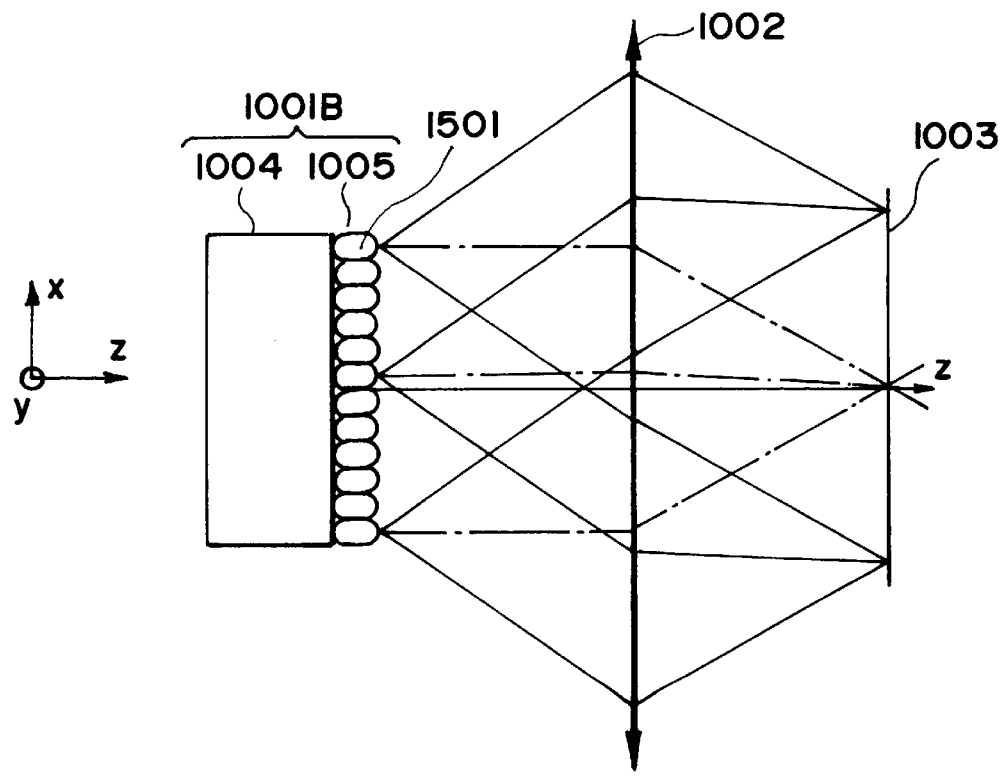

FIGS. 19A and 19B are schematic views, respectively, for explaining a main portion of an illumination optical system according to a ninth embodiment of the present invention. This embodiment differs from the eighth embodiment only in the point of structure of the optical integrator, and the remaining portion has the same structure. Thus, only the portion from the integrator to the surface 1003 is illustrated in the drawings. Denoted in the drawings at 1004 is a first integrator which comprises plural cylindrical element lenses having a power only in the Y-Z plane (more exactly, it should be referred to as a plane parallel to the Y-Z plane but, for convenience of explanation, it is referred to and hereinafter it will be referred to as the Y-Z plane). In this example, the first integrator is provided by three types of cylindrical element lenses (element lenses A) 1401, 1402 and 1403 having different focal lengths. The element lens 1401 has a largest focal length, and the element lens 14-3 has a smallest focal length. These element lenses have entrance side apertures of an oblong shape of the same area.

Denoted at 1005 is a second integrator which comprises cylindrical element lenses (element lenses B) having a power only in the X-Z section.

All the element lenses 1401, 1402 and 1403 have their entrance side apertures disposed optically conjugate with the surface 1003 to be illuminated.

The first integrator 1004 and the second integrator 1005 are components of an optical integrator 1001B.

Figure 20:
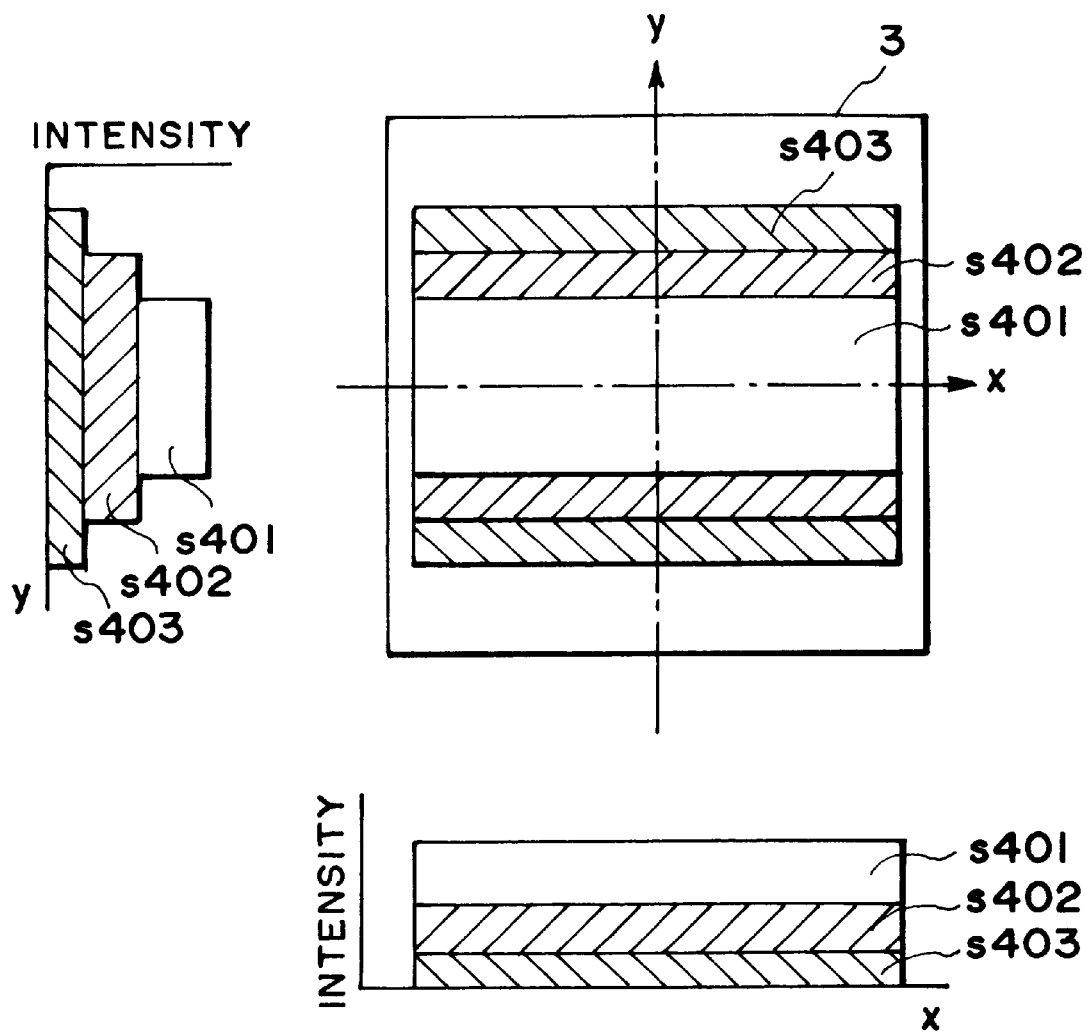
FIG. 20 is a schematic view for explaining an illuminance distribution in the illumination optical system according to the ninth embodiment of the present invention.

FIG. 20 is a schematic view for explaining an illuminance distribution which can be provided in the ninth embodiment. In regard to the Y-axis section, because of different focal lengths like the seventh embodiment, the illumination width in the Y direction differs with the element lenses A. On the other hand, with regard to the X-axis section, because of the element lenses B having the same focal length, the illumination width in the X direction is unchanged. As a result, the combination of element lenses 1401 and 1501 provides an illumination region s401, and the combination of element lenses 1402 and 1501 provides an illumination region s402, while the combination of element lenses 1403 and 1501 defines an illumination region s403. With integration of these illumination regions, with regard to the Y-axis section there is produced an illuminance distribution of an approximately trapezoidal shape. With regard to the X-axis section, there is produced a uniform illuminance distribution.

FIGS. 21A and 21B are schematic views, respectively, for explaining a main portion of an illumination optical system according to a tenth embodiment of the present invention. This embodiment differs from the seventh embodiment only in the point of structure of the optical integrator. The remaining portion has the same structure, and the portion from the integrator to the surface 1003 to be illuminated is illustrated in these drawings. In FIGS. 21A and 21B, denoted at 1006A is an integrator which comprises cylindrical lenses having a power only in the Y-Z sectional plane. The integrator 1006A is provided by different cylindrical lenses 611, 612 and 613 having different focal lengths. Denoted at 1006B is another integrator which comprises cylindrical lenses having a power in the Y-Z sectional plane. The integrator 1006B is provided by cylindrical lenses 1621, 1622 and 1623 having different focal lengths.

The integrators 1006A and 1006B are components of a first integrator 1006. In the first integrator 1006, pairs of cylindrical lenses 1611 and 1621, cylindrical lenses 1621 and 1622, and cylindrical lenses 1613 and 1623 provide element lenses A. The element lens A provided by the first pair has a largest focal length, and the element lens provided by the last pair has a smallest focal length. The element lenses A have entrance side apertures of an oblong shape of the same size.

Denoted at 1007A is an integrator which comprises cylindrical lenses 1701 having a power in the X-Z sectional plane. Denoted at 1007B is an integrator which comprises cylindrical lenses 1702 having a power in the X-Z section. The integrators 1007A and 1007B are components of a second integrator 1007. With the combination of cylindrical lenses 1701 and 1702, the second integrator 1007 provides element lenses B.

The entrance side apertures of the cylindrical lenses constituting the integrator 1006A and the entrance side apertures of the cylindrical lenses constituting the integrator 1007A are disposed optically conjugate with the surface 1003 to be illuminated.

The first integrator 1006 and the second integrator 1007 are components of an integrator 1001C.

In this embodiment, like the ninth embodiment, an illuminance distribution having a trapezoidal shape in the Y-axis section and being uniform in the X-axis section such as shown in FIG. 20 can be produced. Thus, substantially the same effects as those of the ninth embodiment are attainable.

FIG. 22 is a schematic view of a main portion of an illumination optical system according to an eleventh embodiment of the present invention. This embodiment differs from the eighth embodiment only in the point of structure of the optical integrator. The remaining portion has the same structure, and the portion from the integrator to the surface 1003 is illustrated in the drawing. Denoted in the drawing at 1001D is an integrator which comprises three types of element lenses 1801, 1802 and 1803 having the same focal length but having different sizes of entrance side apertures. FIG. 23 is a front view of this integrator.

Here, the size of the illumination region to be defined by each element lens is proportional to the size of the aperture of the element lens. Thus, in this embodiment, three illumination regions of different sizes are superposed, by which an illuminance distribution like that of the eighth embodiment shown in FIG. 14 can be produced. Thus, substantially the same effects as those of the eighth embodiment are attainable.

FIG. 24 is a schematic view of a main portion of an illumination optical system according to a twelfth embodiment of the present invention. This embodiment differs from the eighth embodiment only in the point of structure of the optical integrator. The remaining portion has the same structure, and the portion from the integrator to the surface 1003 to be illuminated is illustrated in the drawing. Denoted in the drawing at 1009A is an integrator which comprises cylindrical lenses having a power only in the Y-Z section. The integrator 1009A is provided by cylindrical lenses 1911, 1912 and 1913 having the same focal length but having entrance side apertures of different sizes.

Denoted at 1009B is an integrator which comprises cylindrical lenses having a power only in the Y-Z section. The integrator 1009B is provided by cylindrical lenses 1921, 1922 and 1923 having the same focal length but having entrance side apertures of different sizes.

The integrators 1009A and 1009B are components of a first integrator 1009. With pairs of cylindrical lenses 1911 and 1921, cylindrical lenses 1912 and 1922, and cylindrical lenses 1913 and 1923, the first integrator 1009 provides element lenses A. The front and rear cylindrical lenses of the element lenses A have entrance side apertures of a square shape of the same size. The element lens A provided by the first pair has a largest entrance side aperture, and the element lens A provided by the last pair has a smallest entrance side aperture.

Denoted at 1010A is an integrator which comprises cylindrical lenses having a power only in the X-Z section. Denoted at 1010B is another integrator which comprises cylindrical lenses having a power only in the X-Z section. The cylindrical lenses of the integrators 1010A and 1010B have the same aperture shape.

The integrators 1010A and 1010B are components of a second integrator 1010. With the pair of cylindrical lenses, the second integrator 1010 provides element lenses B.

Also, the entrance side apertures of the cylindrical lenses constituting the integrator 1009A and the entrance side apertures of the cylindrical lenses constituting the integrator 1010A are disposed optically conjugate with the surface 1003 to be illuminated.

The first integrator 1009 and the second integrator 1010 are components of an integrator 1001E.

In this embodiment, like the ninth embodiment, an illuminance distribution having a trapezoidal shape in the Y-axis section and being uniform in the X-axis section can be produced. Thus, substantially the same effects as those of the ninth embodiment are attainable.

In the eleventh and twelfth embodiments described above, in order to provide a uniform numerical aperture on the surface 1003 to be illuminated, those element lenses adapted to define a different illumination region may desirably be provided with dispersion. For example, in the case of optical integrator 1001D of the eleventh embodiment, the element lenses 801, 802 and 803 may be disposed with dispersion such as illustrated in the front view of FIG. 10.

For dispersed disposition of element lenses, high precision is required in the manufacture and assembling of the element lenses. However, in cases where such element lenses are provided by binary lenses which are diffraction optical elements, they may be produced on a substrate by use of lithographic processes. Thus, production is easy. A few embodiments wherein such binary lenses are used, will be described below.

FIG. 25A is a schematic view of a main portion of an illumination optical system according to a thirteenth embodiment of the present invention. FIG. 25B is an enlarged view of a broken-line portion of FIG. 25A. This embodiment has an integrator equivalent to that of the eleventh embodiment, which integrator is provided by use of binary lenses. The remaining portion has the same structure as that of the eleventh embodiment.

Denoted in FIGS. 25A and 25B at 1011A is a first substrate on which, as best seen in FIG. 15B, small binary optical elements 1111, 1112 and 1113 having the same focal length but having apertures of different sizes are formed in an array. Denoted at 1011B is a second substrate on which, as seen in FIG. 25B, small binary optical elements 1121, 1122, and 1123 having the same focal length but having apertures of different sizes are formed in an array.

Pairs of binary optical elements 1111 and 1121, binary optical elements 1112 and 1122 and binary optical elements 1113 and 1123 provide element lenses. They have entrance side apertures of sizes larger in this order.

The first and second substrates 1011A and 1011B are components of an optical integrator 1011F.

In this embodiment, the element lenses have the same focal length, and the light entrance surfaces of the binary optical elements of the first substrate 1011A are optically conjugate with the surface 1003 to be illuminated. As a result, like the eighth embodiment shown in FIG. 17, an illuminance distribution having a trapezoidal shape both in the Y direction and in the X direction can be produced. Thus, substantially the same effects as those of the eighth embodiment are attainable.

Figure 26A:
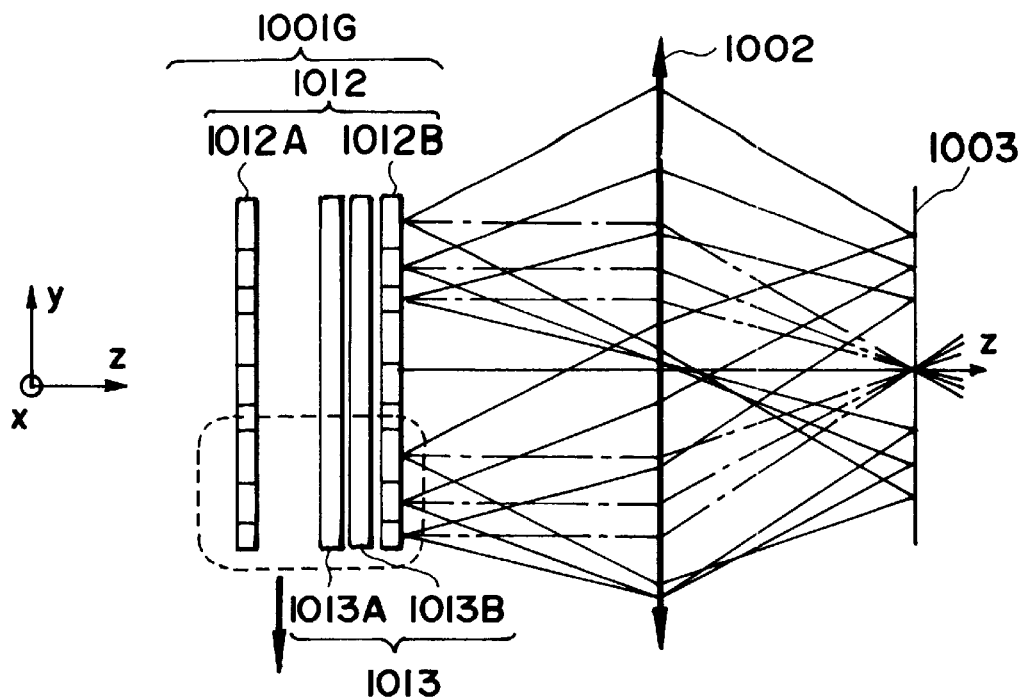
FIGS. 26A and 26B are schematic views, respectively, for explaining an illumination optical system according to a fourteenth embodiment of the present invention.
Figure 26B:
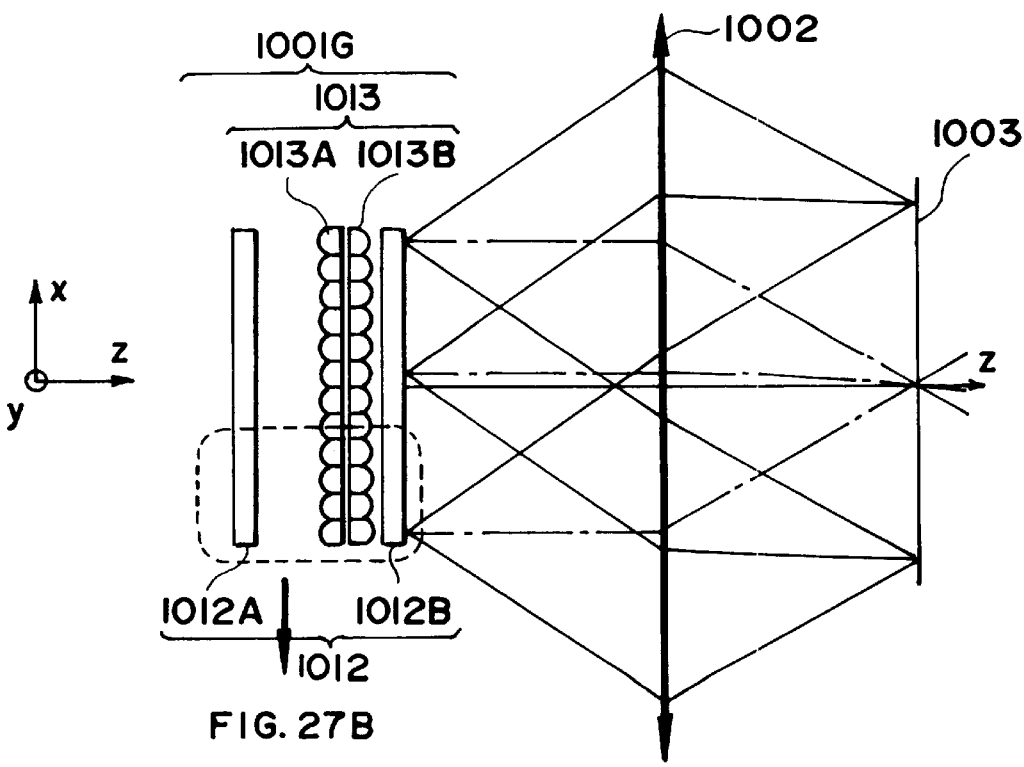
Figure 27A:
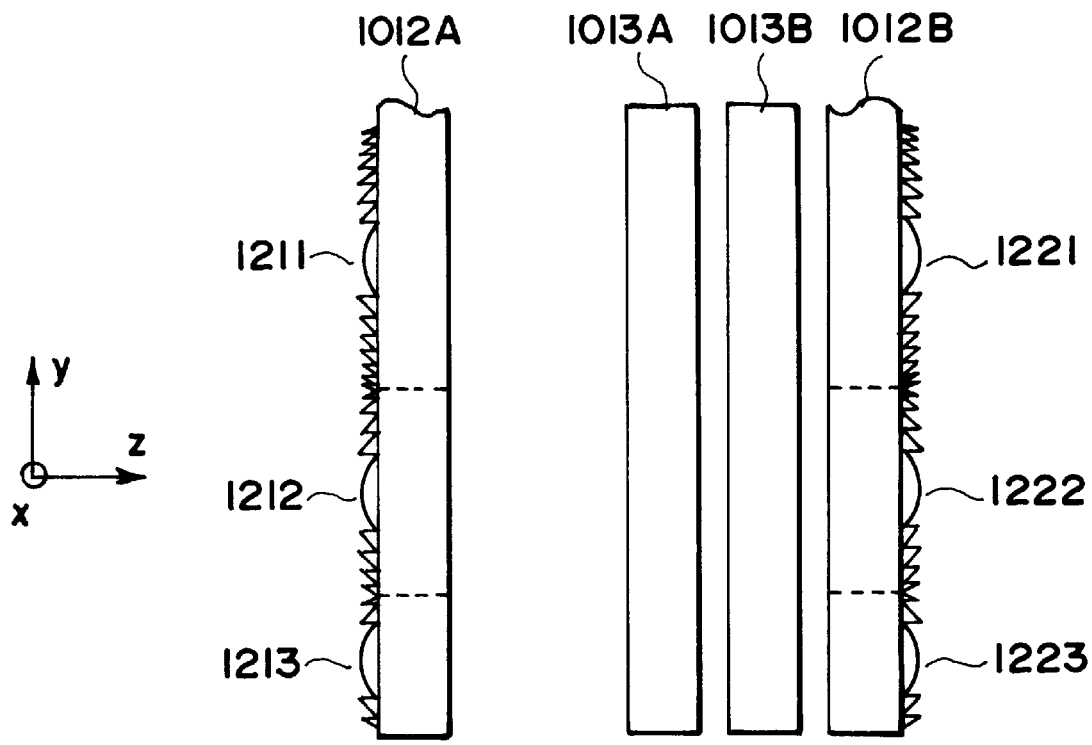
FIGS. 27A and 27B are fragmentary and enlarged views, respectively, of the illumination optical system according to the fourteenth embodiment of the present invention.
Figure 27B:
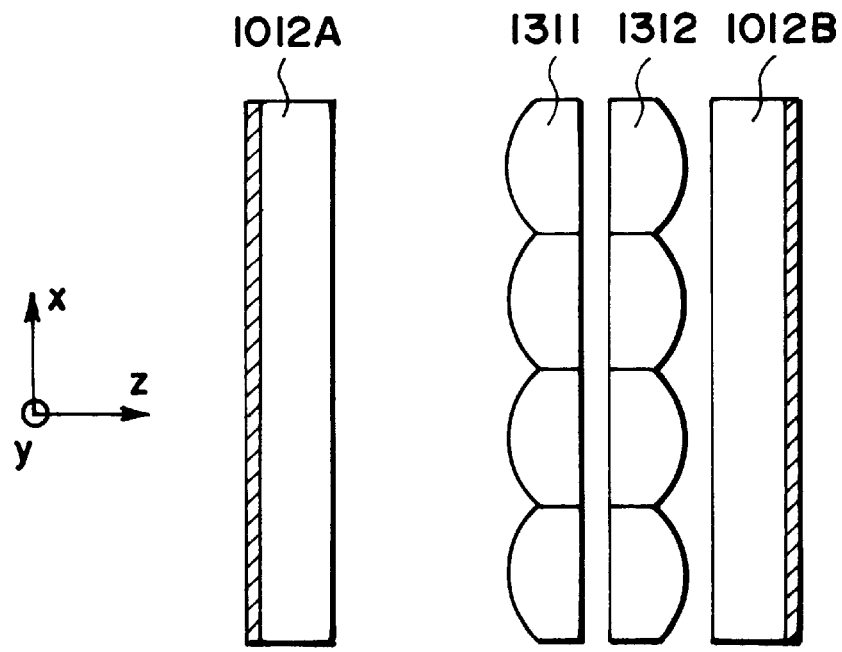

FIGS. 26A and 26B are schematic views of a main portion of an illumination optical system according to a fourteenth embodiment of the present invention. FIGS. 27A and 27B are enlarged views, respectively, of portions depicted by broken lines in FIGS. 26A and 26B, respectively. This embodiment uses an integrator equivalent to that of the tenth embodiment, which integrator is provided by binary optical elements. The remaining portion has the same structure as that of the tenth embodiment.

Denoted in FIGS. 26A–27B at 1012A is a first substrate on which, as best seen in FIG. 27A, three types of cylindrical binary optical elements 1211, 1212, 1213 having the same power only in the Y-Z plane and having apertures in this plane of different sizes are provided in an array. Denoted at 1012B is a second substrate on which, as seen in FIG. 27A, three types of cylindrical binary optical elements 1221, 1222 and 1223 having the same power only in the Y-Z plane and having apertures in this plane of different sizes are provided in an array. Pairs of cylindrical binary optical elements 1211 and 1221, 1212 and 1222, and 1213 and 1223 provide element lenses A. The element lenses A have entrance side apertures of larger sizes in this order. They have the same focal length.

The first and second substrates 1012A and 1012B are components of a first integrator 1012.

FIG. 28 is a fragmentary and enlarged front view of the first substrate 1012A. As illustrated, each cylindrical binary optical element has a phase distribution in the Y direction, but it has no phase distribution in the X direction.

Denoted at 1013A is a first cylindrical lens array which is provided, as best seen in FIG. 27B, by arrayed cylindrical lenses 1311 having a power only in the X-Z plane. Denoted at 1013B is a second cylindrical lens array which is provided, as seen in FIG. 27B, by arrayed cylindrical lenses 1312 having a power only in the X-Z plane. The first and second cylindrical lens arrays 1013A and 1013B are components of a second integrator 1013.

With combinations of these cylindrical lenses 1311 and 1312, element lenses B are provided.

The first and second integrators 1012 and 1013 are components of an integrator 1001G.

The light entrance surfaces of the first substrate 1012A and first cylindrical lens array 1013A are disposed optically conjugate with the surface 1003 to be illuminated. As a result, like the ninth embodiment of FIG. 20, an illuminance distribution having a trapezoidal shape in the Y direction and being uniform in the X direction can be produced with this embodiment. Thus, substantially the same effects as those of the ninth embodiment are attainable.

Figure 29A:
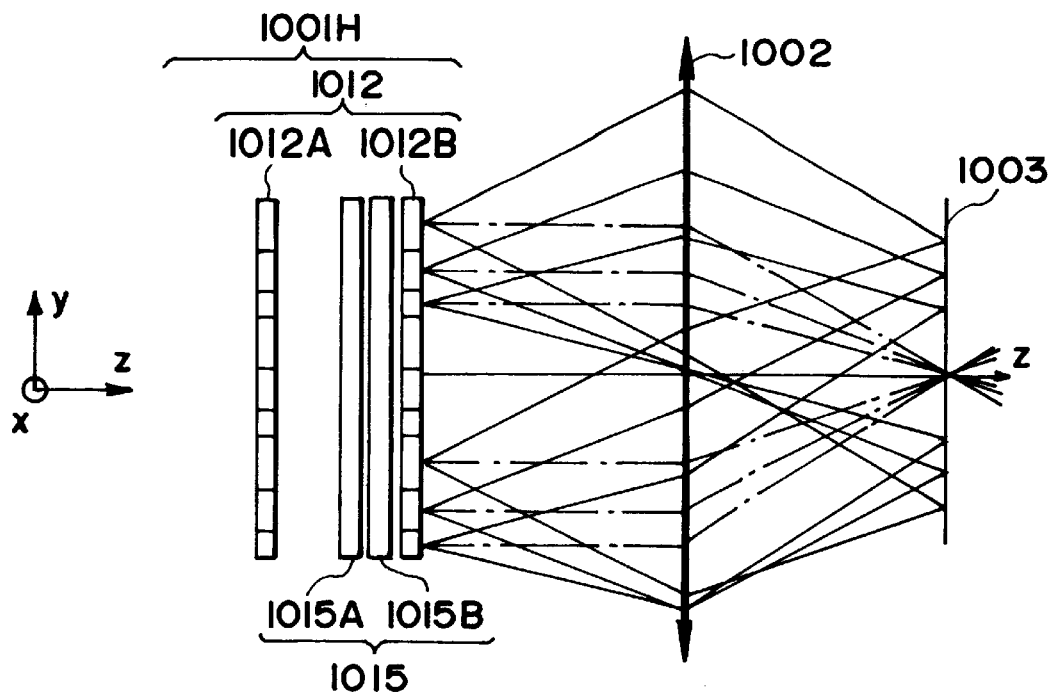
FIGS. 29A and 29B are schematic views, respectively, for explaining an illumination optical system according to a fifteenth embodiment of the present invention.
Figure 29B:
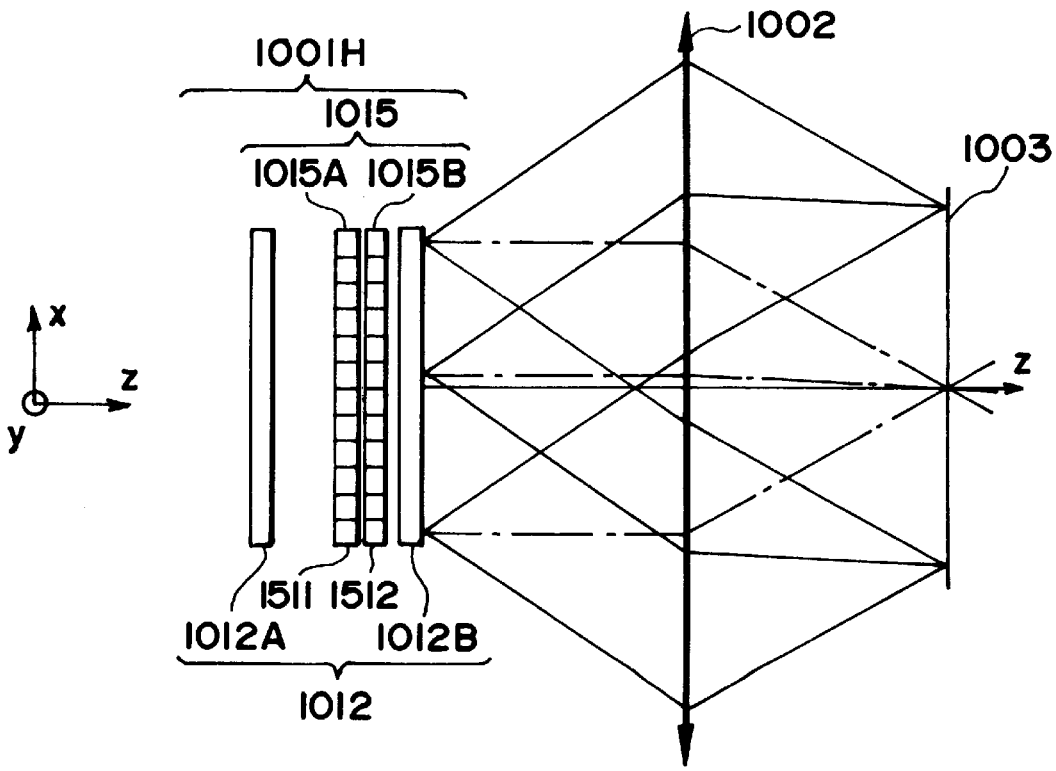

FIGS. 29A and 29B are schematic views of a main portion of an illumination optical system according to a fifteenth embodiment of the present invention. In this embodiment, the cylindrical lens array of the second integrator of the fourteenth embodiment is provided by binary optical elements. The remaining portion has the same structure as that of the fourteenth embodiment.

Denoted in the drawings at 1015A is a third substrate which is provided by cylindrical binary optical elements 1511 having a power only in the X-Z section. Denoted at 1015B is a fourth substrate which is provided by cylindrical binary optical elements 1512 having a power only in the X-Z section. With the combination of these binary optical elements 1511 and 1512, element lenses B are provided. The element lenses B constituted by these elements have entrance side apertures of the same size.

The third and fourth substrates 1015A and 1015B are components of a second integrator 1015. Also, the first and second integrators 1012 and 1015 are components of an integrator 1001H.

The light entrance surfaces of the binary optical elements of the third substrate 1015A are optically conjugate with the surface 1003 to be illuminated.

As a result, like the ninth embodiment of FIG. 20, an illuminance distribution having a trapezoidal shape in the Y direction and being uniform in the X direction can be produced with this embodiment. Thus, substantially the same effects as those of the ninth embodiment are attainable.

While in this embodiment the cylindrical binary optical elements of the second integrator 1015 have entrance side apertures of the same size, the third substrate 1015A and/or fourth substrate 1015B may be provided by different types of cylindrical binary optical elements having different entrance side apertures. On that occasion, the illuminance distribution on the surface 1003 will be such as shown in FIG. 17 of the eighth embodiment.

In the preceding embodiments which use diffraction optical elements, from the standpoint of efficiency of light utilization, preferably those binary lenses of four stages or more may be used.

Next, an embodiment of an exposure apparatus which uses one of the illumination optical systems described above will be explained.

Figure 30:
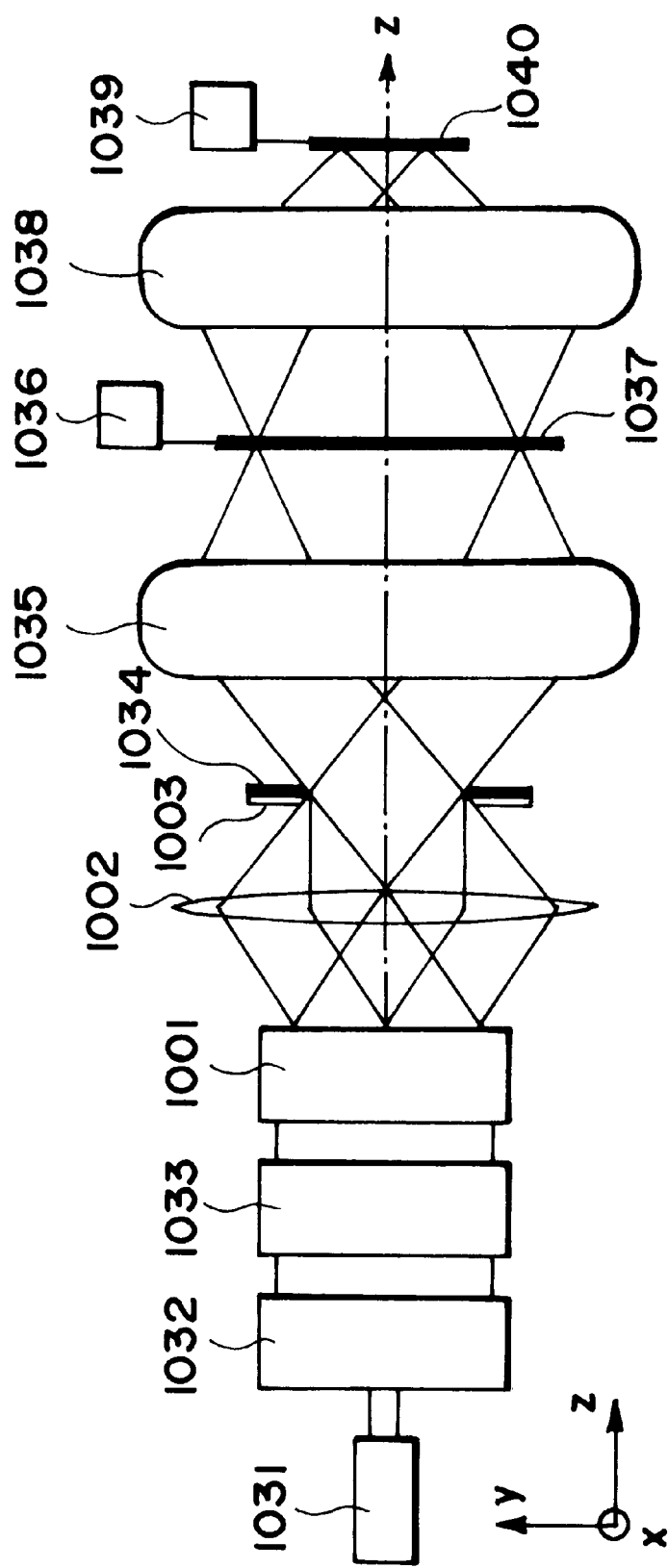
FIG. 30 is a schematic view of a main portion of an exposure apparatus according to an embodiment of the present invention.

FIG. 30 is a schematic view of an exposure apparatus according to an embodiment of the present invention. In the illustrated structure, the portion from a light source 1031 to a surface (masking surface) 1003 to be illuminated corresponds to an illumination optical system according to one of the preceding embodiments. Denoted at 1034 is a field stop. By means of an aperture of this field stop 1034, a light beam of a predetermined sectional shape can be extracted out of the light illuminating the surface 1003. Denoted at 1035 is a masking imaging lens for imaging the light, passing the aperture of the field stop 1034, on a reticle 1037.

Denoted at 1038 is a projection optical system for imaging light from a circuit pattern (first object) of the reticle 1037, on a wafer (second object) 1040. Denoted at 1036 is reticle moving means, and denoted at 1039 is a substrate moving means. The illumination optical system, field stop 1034, and masking imaging lens 1035, for example, are components of an illumination system for illuminating the reticle 1037. Also, an orthogonal X-Y-Z coordinate system taking the Z axis on the optical axis from the condenser lens 1002 to the projection optical system 1038, is set.

In operation of this embodiment, light emitted from the light source 1031 is transformed by a beam shaping optical system 1032 into light of desired beam diameter. Then, by way of exposure amount adjusting means 1033, the light enters an integrator 1001A. By means of this integrator 1001A and the condenser lens 1002, on the masking surface, an illumination region with an illuminance distribution having a trapezoidal shape both in the X direction and in the Y direction is produced. The thus formed illumination region is transferred, via the aperture of the stop aperture 1034, by the masking imaging lens 1035, such that the reticle 1037 is illuminated with the shape of such an illumination region. A portion of the circuit pattern formed on the reticle is thus illuminated with the illumination region, and this portion is projected and printed on the substrate 1040 by means of the projection lens 1038.

Subsequently, the reticle 1037 is moved by the reticle moving means 1036 while the wafer 1040 is moved by the substrate moving means 1039, both in the Y direction, for example, by predetermined amounts, and a portion of the circuit pattern, juxtaposed to the already exposed portion thereof, is exposed. The above-described operation is repeated, and exposures are made in a step-and-repeat method in the Y direction.

After the first-time scan exposure in the Y direction is completed, the reticle 1037 is moved by the reticle moving means 1036 while the wafer 1040 is moved by the substrate moving means 1039, both in the X direction by predetermined amounts, and second-time scan exposure in the negative Y direction is initiated. With this second scan exposure, a portion of the circuit pattern juxtaposed to the portion having been exposed by the first-time scan exposure in the negative Y direction is scanningly exposed. The procedure described above is repeated until the whole circuit pattern is printed on the wafer 1040.

In this embodiment, the efficiency of light utilization is high. Also, each portion of a circuit pattern is illuminated with an illuminance distribution having a trapezoidal shape both with respect to the X direction and with respect to the Y direction. Thus, even if the spacing between adjacent exposure regions shifts minutely due to a variation in scan speed or shift of pulse emission timing, there is not produced a large non-uniformness of the exposure amount. As a result, a satisfactory whole image can be formed.

Next, an embodiment of a device manufacturing method which uses one of the exposure apparatuses described above will be explained.

FIG. 31 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 32:
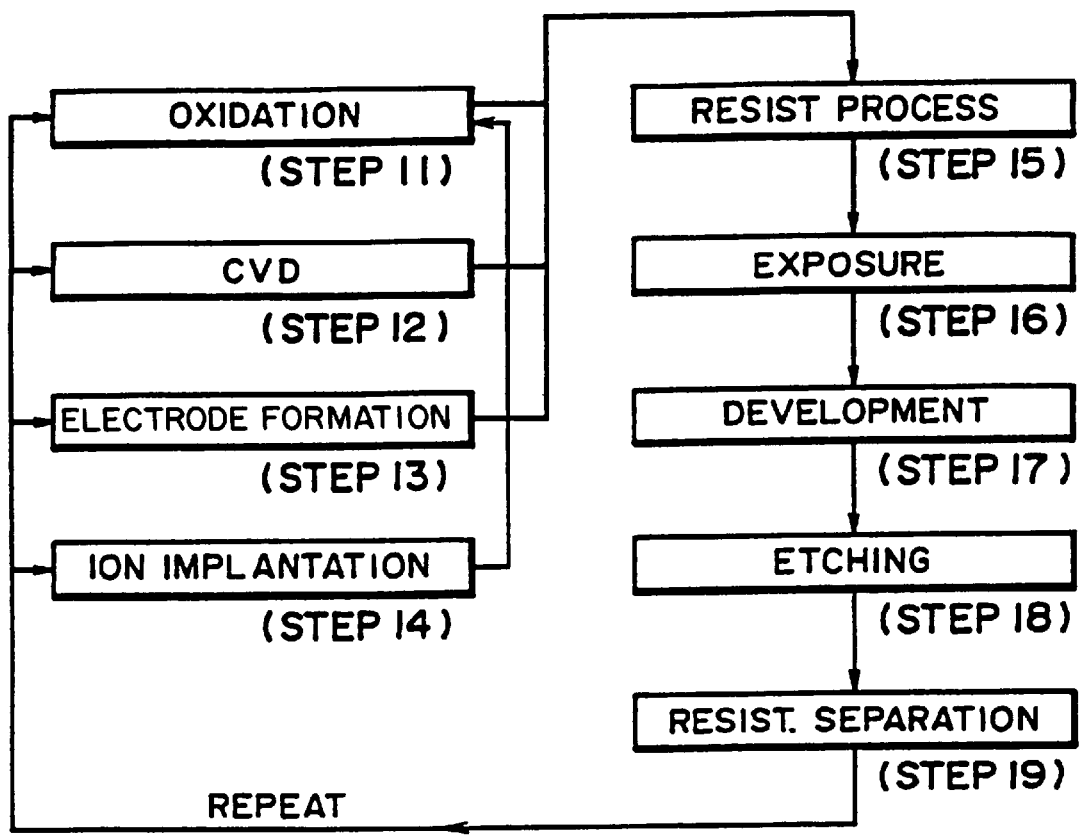
FIG. 32 is a flow chart for explaining a wafer process.

FIG. 32 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:

an optical integrator having element lenses arrayed in a direction perpendicular to an optical axis; and an optical system for Koehler-illuminating a surface to be illuminated, with light from said element lenses of said integrator, wherein said element lenses include particular element lenses having different optical characteristics which are determined so that upon the surface to be illuminated those lights from said particular element lenses are partly superposed one upon another to provide an illuminance distribution having a higher intensity at a central portion thereof and a lower intensity at a peripheral portion thereof on the surface with respect to a predetermined direction.

2. A system according to claim 1, wherein the illuminance distribution has a trapezoidal shape.

3. A system according to claim 2, wherein the illuminance distribution has an isosceles trapezoidal shape.

4. A system according to claim 3, wherein the optical characteristics are determined with respect to a direction of emission of light.

5. A system according to claim 4, wherein each of said element lenses of said integrator includes a front-side lens and a back-side lens, wherein predetermined element lenses of said element lenses of said integrator have their front-side lenses and back-side lenses disposed eccentrically with each other such that lights are projected in directions inclined with respect to the optical axis of said element lenses.

6. A system according to claim 3, wherein the optical characteristics concern a numerical aperture.

7. A system according to claim 6, wherein said particular element lenses having different optical characteristics have different aperture diameters.

8. A system according to claim 6, wherein said particular element lenses having different optical characteristics have different focal lengths.

9. A system according to claim 3, wherein said element lenses of said integrator include a convex lens.

10. A system according to claim 3, wherein said element lenses of said integrator include a diffraction optical element.

11. A system according to claim 10, wherein said diffraction optical element comprises a binary type element.

12. A system according to claim 1, wherein the optical characteristics are determined with respect to a direction of emission of light.

13. A system according to claim 1, wherein each of said element lenses of said integrator includes a front-side lens and a back-side lens, wherein predetermined element lenses of said element lenses of said integrator have their front-side lenses and back-side lenses disposed eccentrically with each other such that lights are projected in directions inclined with respect to the optical axis of said element lenses.

14. A system according to claim 1, wherein the optical characteristics concern a numerical aperture.

15. A system according to claim 14, wherein said particular element lenses having different optical characteristics have different aperture diameters.

16. A system according to claim 14, wherein said particular element lenses having different optical characteristics have different focal lengths.

17. A system according to claim 1, wherein said element lenses of said integrator include a convex lens.

18. A system according to claim 1, wherein said element lenses of said integrator include a diffraction optical element.

19. A system according to claim 18, wherein said diffraction optical element comprises a binary type element.

20. An exposure apparatus having an illumination system as recited in any one of claims 1–19, for illuminating a mask to project a pattern of the mask onto a substrate.

21. An apparatus according to claim 20, further comprising scanning means for relatively and scanningly moving the mask and the substrate relative to said illumination system and in a scan direction, wherein the direction in which the non-uniform illuminance distribution is produced corresponds to the scan direction.

22. An apparatus according to claim 20, further comprising scanning means for relatively and scanningly moving the mask and the substrate relative to said illumination system and in a scan direction, wherein the direction in which the non-uniform illuminance distribution is produced corresponds to each of the scan direction and a direction perpendicular to the scan direction.

23. A device manufacturing method for printing a device pattern of a mask onto a substrate, said method comprising:

providing an optical integrator having element lenses arrayed in a direction perpendicular to an optical axis; and Koehler-illuminating, with an optical system, a mask to be illuminated, with light from the element lenses of the integrator to project a pattern of the mask onto a substrate for printing a device pattern of the mask on the substrate, wherein the element lenses include particular element lenses having different optical characteristics which are determined so that upon the surface to be illuminated those lights from the particular element lenses are partly superposed one upon another to provide an illuminance distribution having a higher intensity at a central portion thereof and a lower intensity at a peripheral portion thereof on the surface with respect to a predetermined direction.

* * * * *

UNITED STATES PATENT AND TRADEMARK OFFICE
CERTIFICATE OF CORRECTION

PATENT NO. : 5,963,305

DATED : October 5, 1999

INVENTOR(S): SATORU MIZOUCHI

Page 1 of 2

It is certified that error appears in the above-identified patent and that said Letters Patent is hereby corrected as shown below:

ON THE COVER PAGE AT ITEM [57] "ABSTRACT":

Line 3, "an" (1st occurrence) should be deleted;
Line 5, "t" should read --to--; and
Line 11, "ditribution" should read --distribution--.

COLUMN 9:

Line 7, "in" should read --in the--;
Line 48, "in" should read --in a--; and
Line 54, "ments" should read --ment--.

COLUMN 12:

Line 55, "a" (1st occurrence) should read --an--.

UNITED STATES PATENT AND TRADEMARK OFFICE
CERTIFICATE OF CORRECTION

PATENT NO. : 5,963,305

DATED : October 5, 1999

INVENTOR(S): SATORU MIZOUCHI

Page 2 of 2

It is certified that error appears in the above-identified patent and that said Letters Patent is hereby corrected as shown below:

COLUMN 18:

Line 7, "of" should read --of a--.

Signed and Sealed this

Thirteenth Day of March, 2001

Attest:

NICHOLAS P. GODICI

Attesting Officer

Acting Director of the United States Patent and Trademark Office